(12) United States Patent
Taherzadeh Boroujeni et al.

(10) Patent No.: US 10,320,456 B2
(45) Date of Patent: Jun. 11, 2019

(54) SYSTEM AND METHOD FOR DESIGNING AND USING MULTIDIMENSIONAL CONSTELLATIONS

(71) Applicant: Huawei Technologies Co., Ltd., Shenzhen (CN)

(72) Inventors: Mahmoud Taherzadeh Boroujeni, Ottawa (CA); Hosein Nikopour, San Jose, CA (US); Alireza Bayesteh, Ottawa (CA); Mohammadhadi Baligh, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/345,174

(22) Filed: Nov. 7, 2016

(65) Prior Publication Data
US 2017/0054483 A1 Feb. 23, 2017

Related U.S. Application Data

(63) Continuation of application No. 13/919,918, filed on Jun. 17, 2013, now Pat. No. 9,509,379.

(51) Int. Cl.
*H04L 27/34* (2006.01)
*H04B 7/0456* (2017.01)
(Continued)

(52) U.S. Cl.
CPC ........ *H04B 7/0456* (2013.01); *H03M 13/616* (2013.01); *H04B 7/0482* (2013.01);
(Continued)

(58) Field of Classification Search
CPC .. H04L 5/0023; H04L 1/0618; H04B 10/5055
See application file for complete search history.

(56) References Cited

U.S. PATENT DOCUMENTS

| | | | |
|---|---|---|---|
| 7,535,975 B1 * | 5/2009 | ten Brink | H04L 27/34 370/210 |
| 7,583,747 B1 | 9/2009 | Damen et al. | |

(Continued)

FOREIGN PATENT DOCUMENTS

| | | |
|---|---|---|
| CN | 101282152 A | 10/2008 |
| CN | 101917365 A | 12/2010 |

(Continued)

OTHER PUBLICATIONS

Hoshyar, et al., "Novel Low-Density Signature for Synchronous CDMA Systems Over AWGN Channel," IEEE Transactions on Signal Processing, vol. 56, No. 4, Apr. 2008, 12 pages.

(Continued)

*Primary Examiner* — Kenneth T Lam
(74) *Attorney, Agent, or Firm* — Slater Matsil, LLP

(57) ABSTRACT

A method for generating a codebook includes applying a unitary rotation to a baseline multidimensional constellation to produce a multidimensional mother constellation, wherein the unitary rotation is selected to optimize a distance function of the multidimensional mother constellation, and applying a set of operations to the multidimensional mother constellation to produce a set of constellation points. The method also includes storing the set of constellation points as the codebook of the plurality of codebooks.

30 Claims, 21 Drawing Sheets

(51) Int. Cl.
*H04L 5/00* (2006.01)
*H04B 7/06* (2006.01)
*H04L 25/03* (2006.01)
*H03M 13/00* (2006.01)

(52) U.S. Cl.
CPC ......... *H04B 7/0617* (2013.01); *H04L 5/0007* (2013.01); *H04L 5/0016* (2013.01); *H04L 25/03929* (2013.01); *H04L 25/03942* (2013.01); *H04L 27/3444* (2013.01)

(56) References Cited

U.S. PATENT DOCUMENTS

| | | | |
|---|---|---|---|
| 8,125,884 | B1 | 2/2012 | Li et al. |
| RE45,230 | E | 11/2014 | Giannakis et al. |
| 9,509,379 | B2* | 11/2016 | Taherzadeh Boroujeni ................ H04B 7/0456 |
| 2002/0126773 | A1 | 9/2002 | Brunel |
| 2005/0220203 | A1 | 10/2005 | Ojard |
| 2005/0286663 | A1 | 12/2005 | Poon |
| 2006/0159195 | A1 | 7/2006 | Ionescu et al. |
| 2007/0268977 | A1* | 11/2007 | Wang .................. H04L 5/0007 375/261 |
| 2009/0097582 | A1 | 4/2009 | Barsoum et al. |
| 2009/0285332 | A1* | 11/2009 | Damen ................ H04B 7/0669 375/299 |
| 2010/0066573 | A1* | 3/2010 | Wu ..................... H03M 13/25 341/51 |
| 2011/0044400 | A1 | 2/2011 | Collings et al. |
| 2011/0135020 | A1 | 6/2011 | Au-Yeung et al. |
| 2011/0222627 | A1 | 9/2011 | Prakash et al. |
| 2012/0027113 | A1 | 2/2012 | Gaal et al. |
| 2012/0039369 | A1 | 2/2012 | Choi et al. |
| 2012/0039402 | A1* | 2/2012 | Clerckx ........... H04L 25/03343 375/259 |
| 2012/0057646 | A1 | 3/2012 | Jovicic et al. |
| 2012/0136912 | A1 | 5/2012 | Kim et al. |
| 2012/0177011 | A1 | 7/2012 | Xi et al. |
| 2013/0121437 | A1 | 5/2013 | Wang et al. |
| 2013/0136203 | A1* | 5/2013 | Chen .................. H04B 7/0639 375/285 |
| 2013/0237261 | A1 | 9/2013 | Bazzi et al. |
| 2013/0251058 | A1 | 9/2013 | Wu et al. |
| 2014/0140360 | A1 | 5/2014 | Nikopour et al. |
| 2014/0161209 | A1* | 6/2014 | Limberg ............. H04L 5/0016 375/299 |
| 2015/0295629 | A1 | 10/2015 | Xia et al. |
| 2016/0043783 | A1* | 2/2016 | Xia .................... H04B 7/0417 370/329 |

FOREIGN PATENT DOCUMENTS

| | | |
|---|---|---|
| CN | 102075487 A | 5/2011 |
| CN | 102130752 A | 7/2011 |
| CN | 102232319 A | 11/2011 |
| EP | 2429083 A1 | 3/2012 |
| JP | 2016501470 A | 1/2016 |
| JP | 2016506143 A | 2/2016 |
| WO | 2006007148 A1 | 1/2006 |
| WO | 2007035993 A1 | 4/2007 |
| WO | 2014075637 A1 | 5/2014 |

OTHER PUBLICATIONS

Boutros, J., et al., "Signal Space Diversity: A Power-and Bandwidth-Efficient Diversity Technique for the Rayleigh Fading Channel," IEEE Transactions on Information Theory, vol. 44, No. 4, Jul. 1998, pp. 1453-1467.

Boutros, J., et al., "Good Lattice Constellations for Both Rayleigh Fading and Gaussian Channels," IEEE Transactions on Information Theory, vol. 42, No. 2, Mar. 1996, pp. 502-518.

Viterbo, E., et al., "A Universal Lattice Code Decoder for Fading Channels," IEEE Transactions on Information Theory, vol. 45, No. 5, Jul. 1999, pp. 1639-1642.

Tran, N.H., et al., "Multidimensional Subcarrier Mapping for Bit-Interleaved Coded OFDM With Iterative Decoding", IEEE Transactions on Signal Processing, Dec. 2007, pp. 5772-5781, vol. 55, No. 12.

* cited by examiner

SYSTEM AND METHOD FOR DESIGNING AND USING MULTIDIMENSIONAL CONSTELLATIONS

CROSS-REFERENCE TO RELATED APPLICATIONS

This application is a continuation of U.S. application Ser. No. 13/919,918, entitled "System and Method for Designing and Using Multidimensional Constellations," filed on Jun. 17, 2013, which application is hereby incorporated herein by reference.

TECHNICAL FIELD

The present disclosure relates generally to digital communications, and more particularly to a system and method for designing and using multidimensional constellations.

BACKGROUND

Code division multiple access (CDMA) is a multiple access technique in which data symbols are spread out over orthogonal and/or near orthogonal code sequences. Traditional CDMA encoding is a two step process in which a binary code is mapped to a quadrature amplitude modulation (QAM) symbol before a spreading sequence is applied. While traditional CDMA encoding can provide relatively high coding rates, new techniques/mechanisms for achieving even higher coding rates are needed to meet the ever-growing demands of next-generation wireless networks. Low density spreading (LDS) is a form of CDMA used for multiplexing different layers of data. LDS uses repetitions of the same symbol on layer-specific nonzero position in time or frequency. As an example, in LDS-orthogonal frequency division multiplexing (OFDM) a constellation point is repeated over nonzero frequency tones of a LDS block. Sparse code multiple access (SCMA) is a generalization of LDS where a multidimensional codebook is used to spread data over tones without necessarily repeating symbols.

SUMMARY

Example embodiments of the present disclosure which provide a system and method for designing and using multidimensional constellations.

In accordance with an example embodiment of the present disclosure, a method for generating a codebook of a plurality of codebooks is provided. The method includes applying, by a designing device, a unitary rotation to a baseline multidimensional constellation to produce a multidimensional mother constellation, wherein the unitary rotation is selected to optimize a distance function of the multidimensional mother constellation, and applying, by the designing device, a set of operations to the multidimensional mother constellation to produce a set of constellation points. The method also includes storing, by the designing device, the set of constellation points as the codebook of the plurality of codebooks.

In accordance with another example embodiment of the present disclosure, a method for transmitting data is provided. The method includes determining, by a transmitting device, a plurality of codebooks, wherein each codebook is generated by applying a unitary rotation to a baseline multidimensional constellation to produce a multidimensional mother constellation and applying a set of operations to the multidimensional mother constellation to produce the codebook, wherein the unitary rotation is selected to optimize a distance function of the multidimensional mother constellation. The method also includes encoding, by the transmitting device, a first data associated with a first data layer by selecting a first codeword from a first codebook, where the first codebook is assigned exclusively to the first data layer, and encoding, by the transmitting device, a second data associated with a second data layer by selecting a second codeword from a second codebook and assigning the second codebook exclusively to the second data layer. The method further includes transmitting, by the transmitting device, the first codeword and the second codeword.

In accordance with another example embodiment of the present disclosure, a method for receiving data is provided. The method includes determining, by a receiving device, a plurality of codebooks, wherein each codebook is generated by applying a unitary rotation to a baseline multidimensional constellation to produce a multidimensional mother constellation and applying a set of operations to the multidimensional mother constellation to produce the codebook, wherein the unitary rotation is selected to optimize a distance function of the multidimensional mother constellation. The method also includes receiving, by the receiving device, an output codeword including a plurality of codewords, wherein each codeword belonging to a different one of the plurality of codebooks, wherein each of the plurality of codebooks is associated with a different one of a plurality of data layers, and identifying, by the receiving device, a first one of a plurality of codewords within the output codeword, the first codeword belonging to a first one of the plurality of codebooks assigned exclusively to a first one of the plurality of data layers. The method further includes decoding, by the receiving device, the first codeword to produce a first data.

In accordance with another example embodiment of the present disclosure, a designing device is provided. The designing device includes a processor. The processor applies a unitary rotation to a baseline multidimensional constellation to produce a multidimensional mother constellation, wherein the unitary rotation is selected to optimize a distance function of the multidimensional mother constellation, applies a set of operations to the multidimensional mother constellation to produce a set of constellation points, and stores the set of constellation points as a codebook of a plurality of codebooks for use in a communications system wherein the codebook is assigned to one of a plurality of data layers.

In accordance with another example embodiment of the present disclosure, a transmitting device is provided. The transmitting device includes a processor, and a transmitter operatively coupled to the processor. The processor determines a plurality of codebooks, wherein each codebook is generated by applying a unitary rotation to a baseline multidimensional constellation to produce a multidimensional mother constellation, the unitary rotation selected to optimize a distance function of the multidimensional mother constellation, and applying a set of operations to the multidimensional mother constellation to produce the codebook. The processor encodes a first data associated with a first data layer by selecting a first codeword from a first codebook, where the first codebook is assigned exclusively to the first data layer, and encodes a second data associated with a second data layer by selecting a second codeword from a second codebook and assigning the second codebook exclusively to the second data layer. The transmitter transmits the first codeword and the second codeword.

In accordance with another example embodiment of the present disclosure, a receiving device is provided. The receiving device includes a processor, and a receiver operatively coupled to the processor. The processor determines a plurality of codebooks, wherein each codebook is generated by applying a unitary rotation to a baseline multidimensional constellation while maintaining a minimum Euclidean distance of the baseline multidimensional constellation to produce a multidimensional mother constellation and applying a set of operations to the multidimensional mother constellation to produce the codebook. The processor identifies a first one of a plurality of codewords within an output codeword, the first codeword belonging to a first one of the plurality of codebooks assigned exclusively to a first one of a plurality of data layers, and decodes the first codeword to produce a first data, wherein the output codeword includes a plurality of codewords, wherein each codeword belongs to a different one of the plurality of codebooks, and wherein each of the plurality of codebooks is associated with a different one of the plurality of data layers. The receiver receives the output codeword.

One advantage of an embodiment is that a systematic approach to designing multidimensional constellations for use as codebooks is provided. The systematic approach can be applied to any multidimensional constellation, including lattice constellations.

A further advantage of an embodiment is that optimization to maximize diversity gain is possible. Furthermore, product distance may be maximized without losing Euclidean distance, which may be especially useful for distributed tones, such as in sparse code multiple access (SCMA) codewords.

BRIEF DESCRIPTION OF THE DRAWINGS

For a more complete understanding of the present disclosure, and the advantages thereof, reference is now made to the following descriptions taken in conjunction with the accompanying drawing, in which.

DETAILED DESCRIPTION OF ILLUSTRATIVE EMBODIMENTS

Figure 1A:
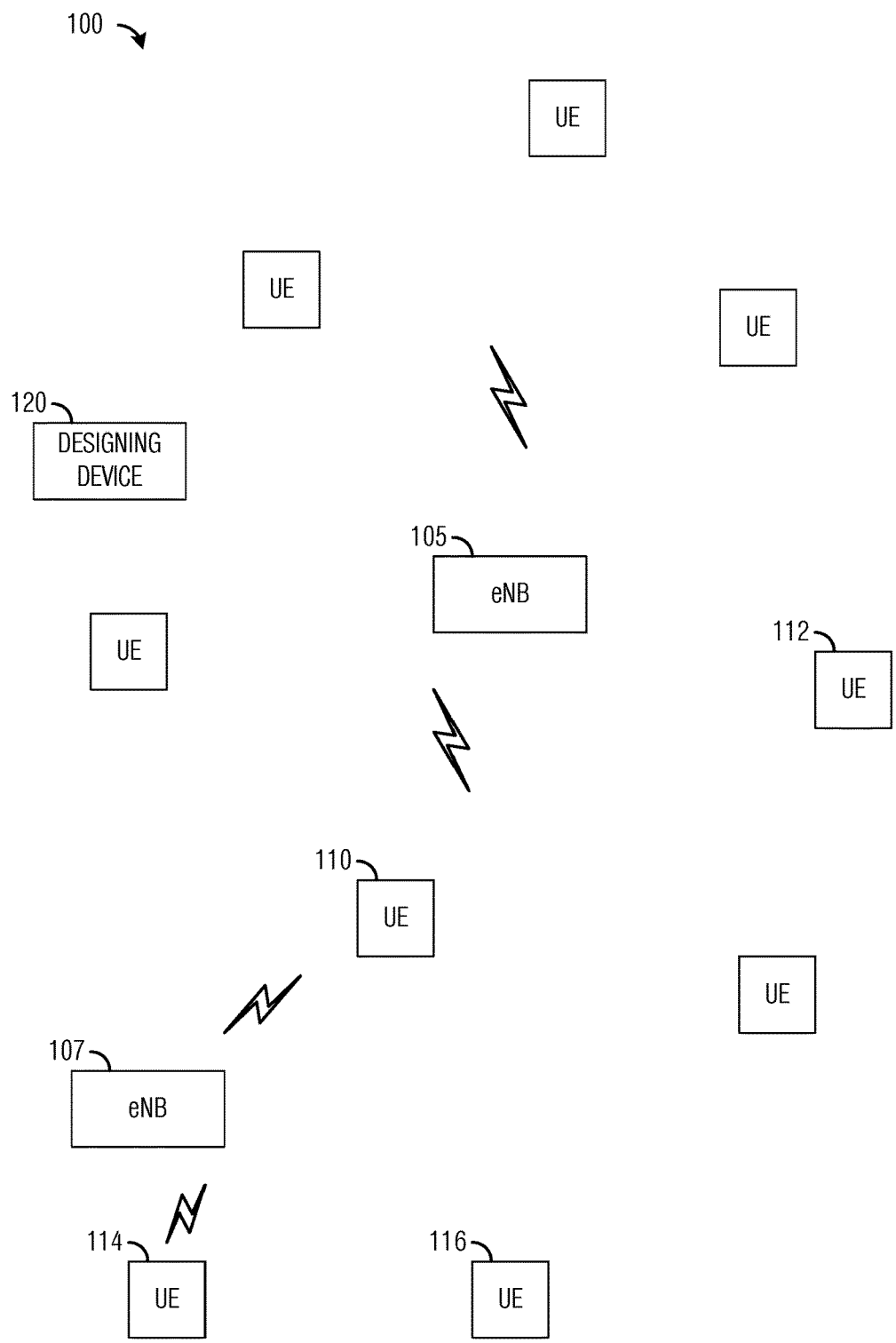
FIG. 1a illustrates an example communications system according to example embodiments described herein.

The operating of the current example embodiments and the structure thereof are discussed in detail below. It should be appreciated, however, that the present disclosure provides many applicable inventive concepts that can be embodied in a wide variety of specific contexts. The specific embodiments discussed are merely illustrative of specific structures of the disclosure and ways to operate the disclosure, and do not limit the scope of the disclosure.

One embodiment of the disclosure relates to designing and using multidimensional constellations. As an example, a designing device applies a unitary rotation to a baseline multidimensional constellation to produce a multidimensional mother constellation, wherein the unitary rotation is selected to optimize a distance function of the multidimensional mother constellation, applies a set of operations to the multidimensional mother constellation to produce a set of constellation points, and stores the set of constellation points as the codebook of the plurality of codebooks for use in a communications system wherein the codebook is assigned to one of a plurality of data layers.

As another example, a transmitting device determines a plurality of codebooks, wherein each codebook is generated by applying a unitary rotation to a baseline multidimensional constellation to produce a multidimensional mother constellation and applying a set of operations to the multidimensional mother constellation to produce the codebook, wherein the unitary rotation is selected to optimize a distance function of the multidimensional mother constellation. The transmitting device encodes a first data associated with a first data layer by selecting a first codeword from a first codebook, where the first codebook is assigned exclusively to the first data layer, encodes a second data associated with a second data layer by selecting a second codeword from a second codebook and assigning the second codebook exclusively to the second data layer, and transmits the first codeword and the second codeword.

As another example, a receiving device determines a plurality of codebooks, wherein each codebook is generated by applying a unitary rotation to a baseline multidimensional constellation to produce a multidimensional mother constellation and applying a set of operations to the multidimensional mother constellation to produce the codebook, wherein the unitary rotation is selected to optimize a distance function of the multidimensional mother constellation. The receiving device receives an output codeword including a plurality of codewords, wherein each codeword belonging to a different one of the plurality of codebooks, wherein each of the plurality of codebooks is associated with a different one of a plurality of data layers, identifies a first one of a plurality of codewords within the output codeword, the first codeword belonging to a first one of the plurality of codebooks assigned exclusively to a first one of the plurality of data layers, and decodes the first codeword to produce a first data.

The present disclosure will be described with respect to example embodiments in a specific context, namely a communications system that uses sparse code multiple access (SCMA) to provide high data rates to meet demands for greater data traffic. The disclosure may also be applied, however, to other standards compliant and non-standards communications systems that use codebooks derived from multidimensional mother constellations to increase communication rates.

SCMA is an encoding technique that encodes data streams, such as binary data streams, or in general, M-ary data streams, where M is an integer number greater than or equal to 2, into multidimensional codewords. SCMA directly encodes the data stream into multidimensional codewords and circumvents quadrature amplitude modulation (QAM) symbol mapping, which may lead to coding gain over conventional CDMA encoding. Notably, SCMA encoding techniques convey data streams using a multidimensional codeword rather than a QAM symbol.

Additionally, SCMA encoding provides multiple access through the use of different codebooks for different multiplexed layers, as opposed to the use of different spreading sequences for difference multiplexed layers, e.g., a LDS signatures in LDS, as is common in conventional CDMA encoding. Furthermore, SCMA encoding typically uses codebooks with sparse codewords that enable receivers to use low complexity algorithms, such as message passing algorithms (MPA), to detect respective codewords from combined codewords received by the receiver, thereby reducing processing complexity in the receivers.

FIG. 1a illustrates an example communications system 100. Communications system 100 includes a plurality of enhanced NodeBs (eNB), such as eNB 105 and eNB 107, which may serve a plurality of user equipment (UE), such as UE 110-116. An eNB may also be referred to as a communications controller, a base station, a controller, and the like, while a UE may also be referred to as a mobile station, a user, a terminal, a subscriber, and the like. In general, an eNB may have multiple transmit antenna, allowing it to transmit to multiple UEs, to transmit multiple layers to a single UE, or a combination thereof. Furthermore, a first eNB may transmit to a UE that is also receiving a transmission from a second UE. The devices (e.g., eNBs 105-107, and UEs 110-116) may communicate using SCMA.

While it is understood that communications systems may employ multiple eNBs capable of communicating with a number of UEs, only two eNBs, and a number of UEs are illustrated for simplicity.

Communications system 100 may also include a designing device 120 that may be used to design codebooks for use by eNBs, UEs, and the like, in communications system 100. In general, the codebooks may be used by transmitting devices and/or receiving devices. Designing device 120 may design a plurality of codebooks, with each codebook being assigned to a different multiplexed layer. Designing device 120 may provide the plurality of codebooks to the eNBs in communications system 100, which may, in turn, provide the plurality of codebooks to UEs as the UEs associate with communications system 100. Alternatively, designing device 120 may save the plurality of codebooks to a storage device, such as a centralized database, a remote disk drive, and the like. The plurality of codebooks may be retrieved from the storage device as needed by the eNBs and/or UEs.

Figure 1B:
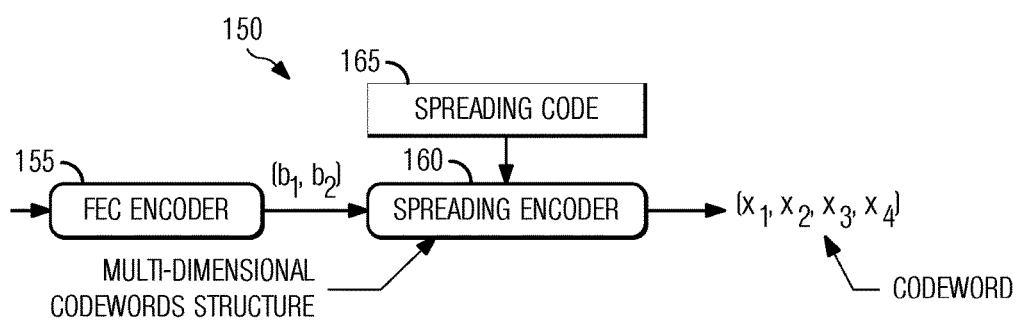
FIG. 1b illustrates an example SCMA encoder for encoding data according to example embodiments described herein.

FIG. 1b illustrates an example SCMA encoder 150 for encoding data. As shown in FIG. 1b, SCMA encoder 150 maps a data stream, e.g., a binary data stream ($b_1$, $b_2$), received from a forward error correcting (FEC) encoder 155 to multidimensional codewords to obtain an encoded data stream ($x_1$, $x_2$, $x_3$, $x_4$) using a spreading decoder 160 and a spreading code(s) 165. The multidimensional codewords may belong to different multidimensional codebooks, with each codebook being associated with a different multiplexed layer. As discussed herein, the multiplexed layers may include any layer over which multiplexed data streams may be communicated over shared resources of a communications system. As an example, multiplexed layers may comprise multiple input, multiple output (MIMO) spatial layers, orthogonal frequency division multiple access (OFDMA) tones, time division multiple access (TDMA) layers, and the like.

Figure 2:
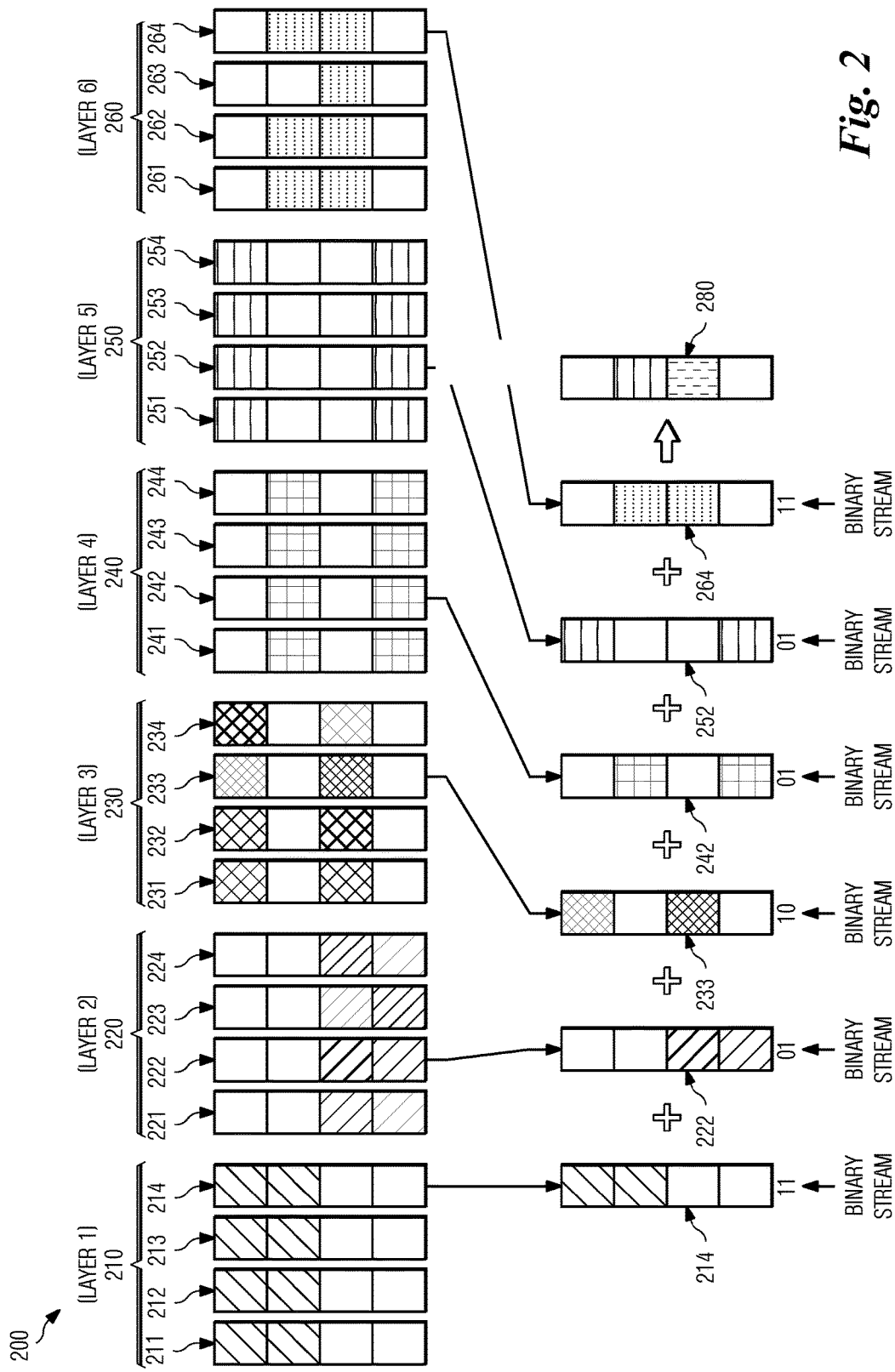
FIG. 2 illustrates an example SCMA multiplexing scheme for encoding data according to example embodiments described herein.

FIG. 2 illustrates an example SCMA multiplexing scheme 200 for encoding data. As shown in FIG. 2, SCMA multiplexing scheme 200 may utilize a plurality of codebooks, such as codebook 210, codebook 220, codebook 230, codebook 240, codebook 250, and codebook 260. Each codebook of the plurality of codebooks is assigned to a different multiplexed layer. Each codebook includes a plurality of multidimensional codewords. More specifically, codebook 210 includes codewords 211-214, codebook 220 includes codewords 221-224, codebook 230 includes codewords 231-234, codebook 240 includes codewords 241-244, codebook 250 includes codewords 251-254, and codebook 260 includes codewords 261-264.

Each codeword of a respective codebook may be mapped to a different data, e.g., binary, value. As an illustrative example, codewords 211, 221, 231, 241, 251, and 261 are mapped to binary value '00', the codewords 212, 222, 232, 242, 252, and 262 are mapped to the binary value '01', the codewords 213, 223, 233, 243, 253, and 263 are mapped to the binary value '10', and the codewords 214, 224, 234, 244, 254, and 264 are mapped to the binary value '11'. It is noted that although the codebooks in FIG. 2 are depicted as having four codewords each, SCMA codebooks in general may have any number of codewords. As an example, SCMA codebooks may have 8 codewords (e.g., mapped to binary values '000' . . . '111'), 16 codewords (e.g., mapped to binary values '0000' . . . '1111'), or more.

As shown in FIG. 2, different codewords are selected from various codebooks 210, 220, 230, 240, 250, and 260 depending on the binary data being transmitted over the multiplexed layer. In this example, codeword 214 is selected from codebook 210 because the binary value '11' is being transmitted over the first multiplexed layer, codeword 222 is selected from codebook 220 because the binary value '01' is being transmitted over the second multiplexed layer, codeword 233 is selected from codebook 230 because the binary value '10' is being transmitted over the third multiplexed layer, codeword 242 is selected from codebook 240 because the binary value '01' of is being transmitted over the fourth multiplexed layer, codeword 252 is selected from codebook 250 because the binary value '01' is being transmitted over the fifth multiplexed layer, and codeword 264 is selected from codebook 260 because the binary value '11' is being transmitted over the sixth multiplexed layer. Codewords 214, 222, 233, 242, 252, and 264 may then be combined together to form multiplexed data stream 280, which is transmitted over shared resources of a network. Notably, codewords 214, 222, 233, 242, 252, and 264 are sparse codewords, and therefore can be identified upon reception of multiplexed data stream 280 using a low complexity algorithm, such as MPA.

Figure 3A:
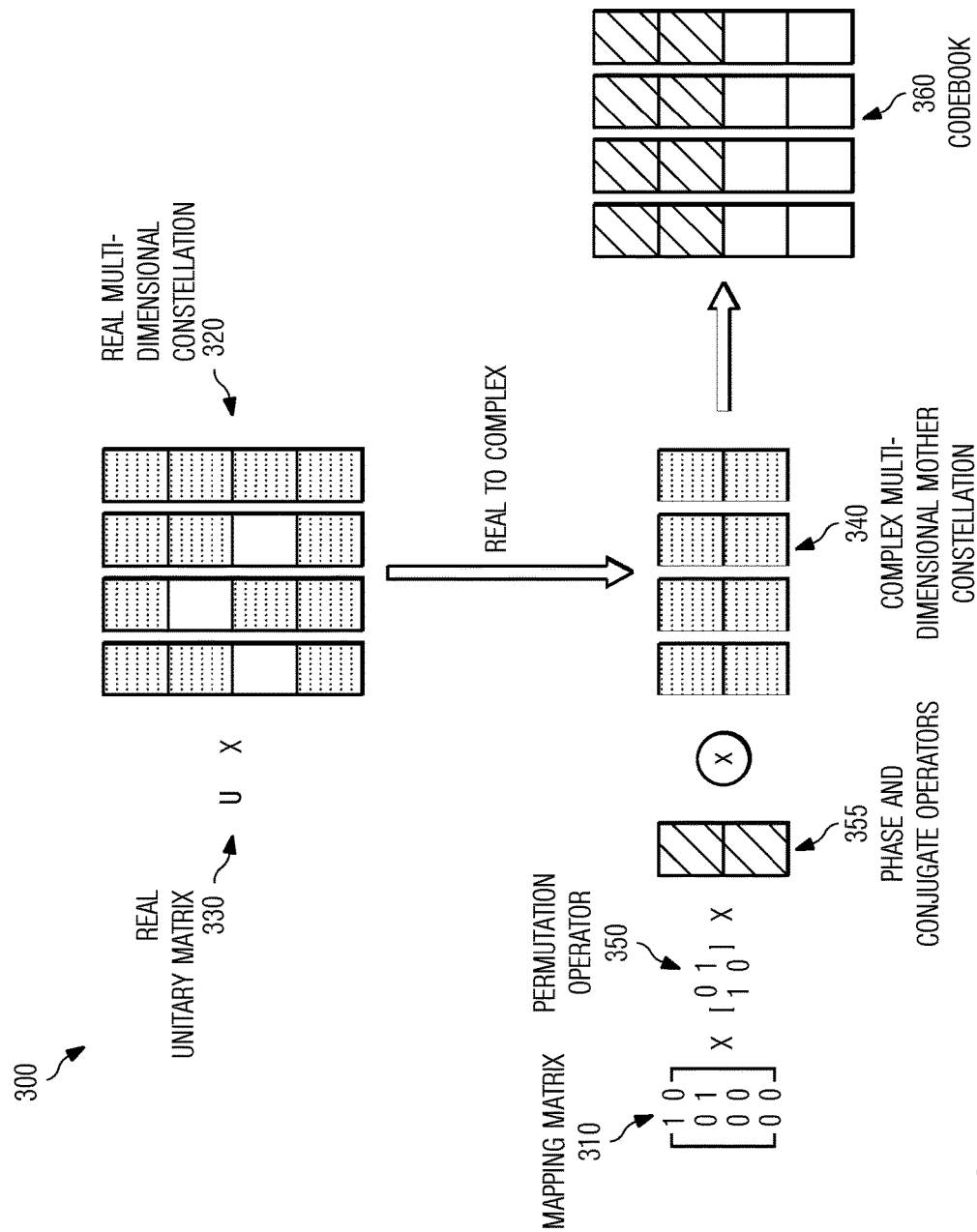
FIG. 3a illustrates an example technique for generating a codebook according to example embodiments described herein.

FIG. 3a illustrates a technique 300 for generating a codebook 360. Codebook 360 may be used in a communications system using SCMA. In general, codebook 360 may be derived from one or more multidimensional complex constellations. As shown in FIG. 3a, technique 300 includes selecting parameters 310-355, which include a mapping matrix 310, a real multidimensional constellation 320, a real unitary matrix 330, a multidimensional complex mother constellation 340, a permutation operator 350, and phase and conjugate operators 355. Additionally, operator X represents a matrix multiply operation, while operator ⊗ represents a permutation operation. It is noted that in some embodiments, multiple multidimensional complex mother constellations may be used to generate codebooks. Technique 300 may include an additional step of allocating phase conjugate operators to incoming branches of a resource node. Codebook 360 may be obtained by combining parameters 310-355 in the manner as shown in FIG. 3. In summary, multidimensional complex mother constellation 340 (produced by multiplying real multidimensional constellation 320 with real unitary matrix 330 (as well as a real to complex conversion if the result of the multiplying of real multidimensional constellation 320 with real unitary matrix 330 is real), for example) may be permuted by phase and conjugate operators 355 multiplied by mapping matrix 310 which may have been determined in accordance with non-zero tones assigned to a particular multiplexed layer or user.

According to an example embodiment, multidimensional complex mother constellation 340 may be designed in such a way as to maximize diversity gain. Furthermore, the product distance may be maximized while maintaining Euclidean distance, which may be especially useful for distributed tones, such as those used in SCMA codebooks.

According to the example embodiment, a systematic approach for use in designing multidimensional complex mother constellations, such as multidimensional complex mother constellation 340, for use in generating SCMA codebooks is presented.

Figure 3B:
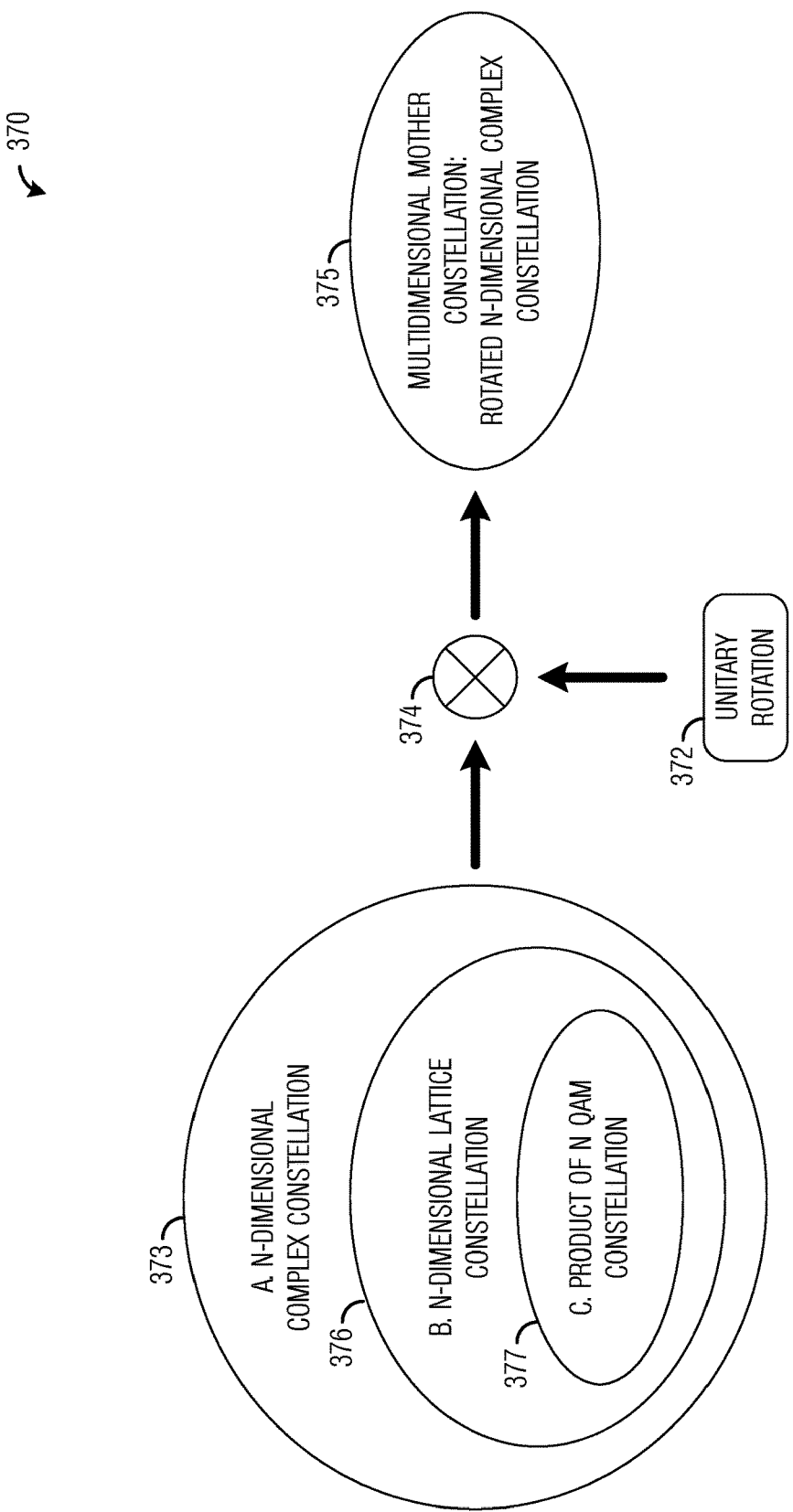
FIG. 3b illustrates an example high-level view of a technique for generating a multidimensional complex mother constellation according to example embodiments described herein.

FIG. 3b illustrates a high-level view of a technique 370 for generating a multidimensional complex mother constellation. As discussed previously, a unitary rotation 372 may be applied to an N-dimensional complex constellation 373 using a matrix multiplication operations 374 to produce a multidimensional mother constellation 375, which is a rotated N-dimensional complex constellation. However, to obtain good performance in communications systems, such as SCMA communications systems, a design criterion that may be used in selecting N-dimensional complex constellation 373 is to maximize the minimum Euclidean distance. Furthermore, an additional design criterion may be to reduce the number of neighboring points in each constellation. It is noted that unitary rotation 372 may be applied in real and/or imaginary domains.

Unitary rotation 372 may also be selected in accordance with a design criterion that specifies that unitary rotation 372 optimizes (e.g., maximize or minimize) a distance function of points in multidimensional mother constellation 375 while maintaining Euclidean distance of N-dimensional complex constellation 373. The distance function may be considered in general to be a function of the distances of the projections of the points in multidimensional mother constellation 375. As an example, the distance function may be the minimum product distance of the projections of points in multidimensional mother constellation 375, which may be described as the minimum of the product of distances of projections of each pair of points in multidimensional mother constellation 375. Other examples of distance functions include: an average product distance of constellation points (pair wise average, for example) in multidimensional mother constellation 375, a minimum of a generalized mean of distances of projections for pairs of constellation points of multidimensional mother constellation 375 with exponent p (where p ranges from [0, 1]), and the like. It is noted that it is possible to use any specific function of the distance of the projections of the points in multidimensional mother constellation 375 as the distance function. A sub-optimal design criterion for unitary rotation 372 may be to increase the above design criterion (maximizing the minimum product distance of the projections of points in multidimensional mother constellation 375 while maintaining Euclidean distance of N-dimensional complex constellation 373) but at the same time, reducing the number of projections per complex dimension. As an illustrative example, N-dimensional complex constellation 373 may contain 16 points but after application of unitary rotation 372, the projections of multidimensional mother constellation 375 may contain 9 points for lower detection complexity.

Generally, the use of N-dimensional complex constellation 373 may produce optimal results. However, the design of such a constellation that meets its corresponding design criterion may be difficult. It may be able to use other constellations that are easier to design and more suitable for labeling (especially for applying Gray labeling), but may trade-off sub-optimal results. As an example, in place of N-dimensional complex constellation 373, an N-dimensional lattice constellation 376 or a product of N QAM constellations 377 may be used. It is noted that moving from N-dimensional complex constellation 373 to N-dimensional lattice constellation 376 to product of N QAM constellations 377 also moves toward easier design, but also towards less optimal results. It is noted that if product of N QAM constellations 377 is used in place of N-dimensional complex constellation 373, unitary rotation 372 may induce dependencies among dimensions of multidimensional mother constellation 375, which may be useful in recovery of data at the receiver.

Figure 3C:
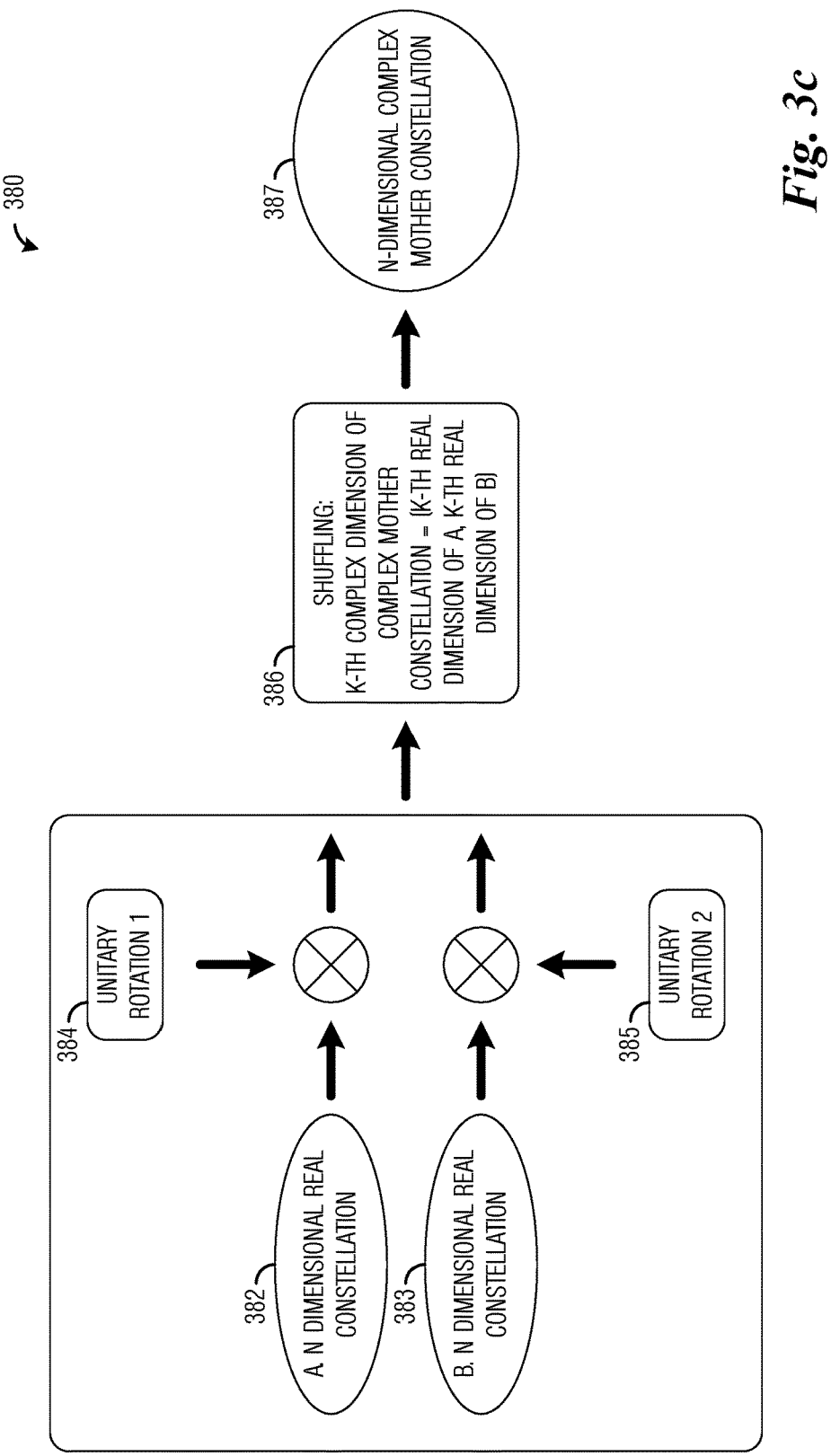
FIG. 3c illustrates an example high-level view of a technique for generating a multidimensional complex mother constellation using multiple real constellations according to example embodiments described herein.

FIG. 3c illustrates a high-level view of a technique 380 for generating a multidimensional complex mother constellation using multiple real constellations. Instead of using an N-dimensional complex constellation to generate a multidimensional mother constellation, two independent N-dimensional real constellations, a first N-dimensional real constellation 382 and a second N-dimensional real constellation 383, may be used. The two independent N-dimensional real constellations may be rotated with two unitary rotations, a first unitary rotation 384 and a second unitary rotation 385, respectively. The resulting two rotated N-dimensional real constellations may be considered parts of the multidimensional mother constellation (an N-dimensional complex mother constellation). Hence, two N-dimensional real constellations may be used to generate a single N-dimensional complex mother constellation. The two independent N-dimensional real constellations may be rotated independently of one another with different unitary rotations.

Shuffling 386 may be applied to the resulting two rotated N-dimensional real constellations to produce N-dimensional complex mother constellation 387. Shuffling 386 may be expressed as the K-th complex dimension of the multidimensional mother constellation being equal to the K-th real dimension of the rotated version of first N-dimensional real constellation 382 and the K-th real dimension of the rotated version of second N-dimensional real constellation 383. In general, shuffling 386 induces dependency among dimensions of N-dimensional complex mother constellation 387.

Figure 3D:
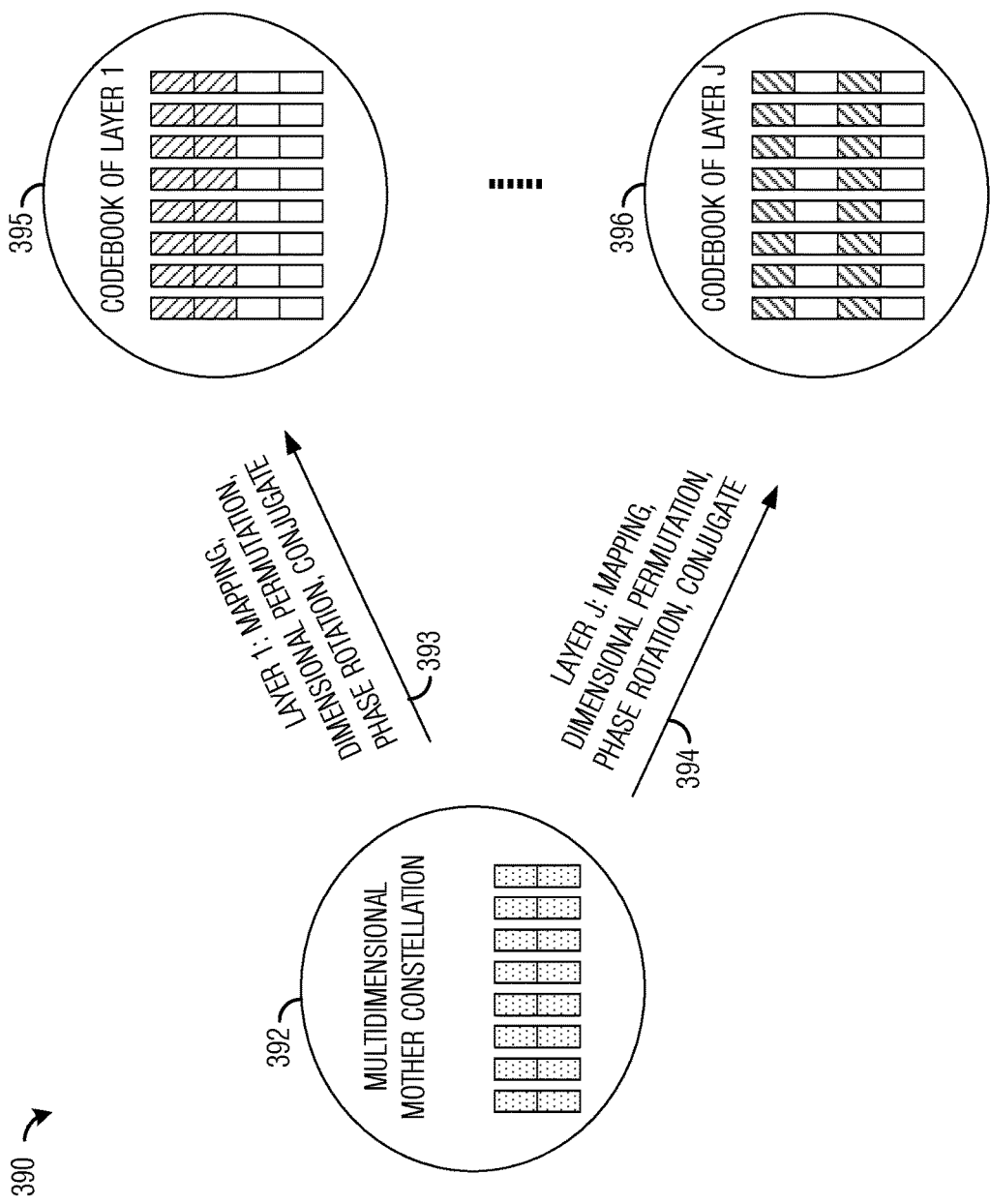
FIG. 3d illustrates an example high-level view of a technique for generating codebooks from a multidimensional complex mother constellation according to example embodiments described herein.

FIG. 3d illustrates a high-level view of a technique 390 for generating codebooks from a multidimensional complex mother constellation 392. In general, operations, such as mapping operations, dimensional permutation operations, phase rotation operations, conjugate operations, and combinations thereof, may be used to generate codebooks from multidimensional complex mother constellation 392. A first set of operations 393 may be applied to multidimensional complex mother constellation 392 to generate a first codebook 395, which may be assigned to a first layer. Similarly, a second set of operations 394 may be applied to multidimensional complex mother constellation 392 to generate a second codebook 396, which may be assigned to a second layer. Typically, a different set of operations may be used to generate a different codebook. However, it may be possible to use different multidimensional complex mother constellations in the generation of codebooks. As an illustrative example, two multidimensional complex mother constellations may be used in conjunction with three sets of operations to generate a total of 6 codebooks.

In general, the technique of applying a unitary rotation to a multidimensional complex constellation may be used for generating a multidimensional complex mother constellation. It may be used to generate a multidimensional complex mother constellation with maximized diversity gain and/or optimized distance function(s), such as maximized minimum product distance. The generated multidimensional complex mother constellation may be especially useful for use in SCMA communications system. The technique may include applying a unitary rotation that is specifically selected to maximize product distance to a multidimensional complex constellation with optimized minimum Euclidean distance. The unitary rotation may also maximize the diversity gain.

Figure 4:
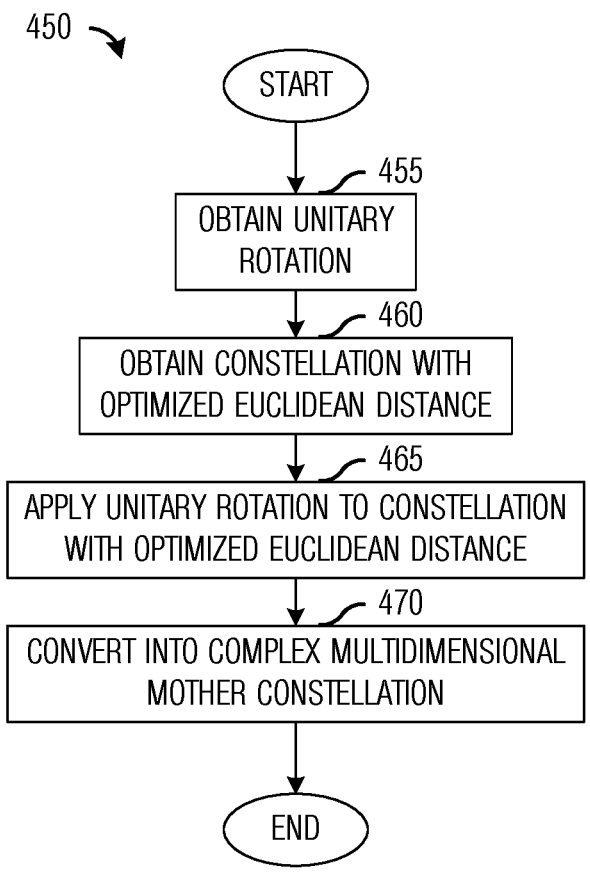
FIG. 4 illustrates an example flow diagram of operations in generating a multidimensional complex constellation according to example embodiments described herein.

FIG. 4 illustrates a flow diagram of operations 450 in generating a multidimensional complex mother constellation. Operations 450 may be indicative of operations occurring in device, such as a transmitting device, e.g., an eNB transmitting a downlink transmission to a UE, or a UE transmitting an uplink transmission to an eNB, or a designing device that generates codebooks, as the device generates a multidimensional complex mother constellation.

Operations 450 may begin with the device obtaining a unitary rotation that optimizes a distance function (block 455). The unitary rotation may optimize the distance function, i.e., a function of the distances of the projections of the points, such as maximize the minimum product distance, while maintaining Euclidean distance. The unitary rotation may be stored in a memory and retrieved by the device. Furthermore, a single unitary rotation may be used to generate the multidimensional complex mother constellations. Alternatively, multiple unitary rotations may be used to generate the multidimensional complex mother constellations, with specific unitary rotations being selected in accordance with a selection criterion, such as a multiplexed layer number, multiplexed layer identifier, user identifier, and the like. The device may obtain a constellation with optimized Euclidean distance (block 460). The constellation may be stored in a memory and retrieved by the device. The device may apply the unitary rotation to the constellation, producing a multidimensional constellation (block 465). If the resulting constellation after application of the unitary rotation is real, a conversion, such as a real-to-complex operation, may convert the real multidimensional constellation to a multidimensional complex mother constellation (block 470).

According to an example embodiment, as discussed previously, it may be possible to utilize a sub-optimal constellation generated by multiplying smaller constellations. In general, the sub-optimal constellation may be generated using independent smaller constellation per dimension of the sub-optimal constellation. The use of the smaller constellations may reduce computational requirements when compared to a fully dimensioned constellation. Typically, the sub-optimal constellation may not have optimized Euclidean distance. As an illustrative example, two 4-point constellations, each in 2 real dimensions, may be multiplied together to produce a 16-point constellation in 4 real dimensions. The two 4-point constellations may have independent quadrature amplitude modulation (QAM) per dimension. It is noted that rotation of orthogonal constellations (i.e., independent QAM points on non-zero tones) may be used to induce dependency among non-zero tones and to mitigate the impact of collisions. Furthermore, diversity (or equivalently, collision avoidance), which may be quantified by minimum product distance, may be achieved without sacrificing minimum Euclidean distance. A technique such as Gray labeling may be used for the QAMs. A unitary rotation may be applied to the sub-optimal constellation as described above to optimize a distance function (i.e., a function of the distances of the projections of the points) of the sub-optimal constellation, such as the minimum product distance, for example.

Figure 5:
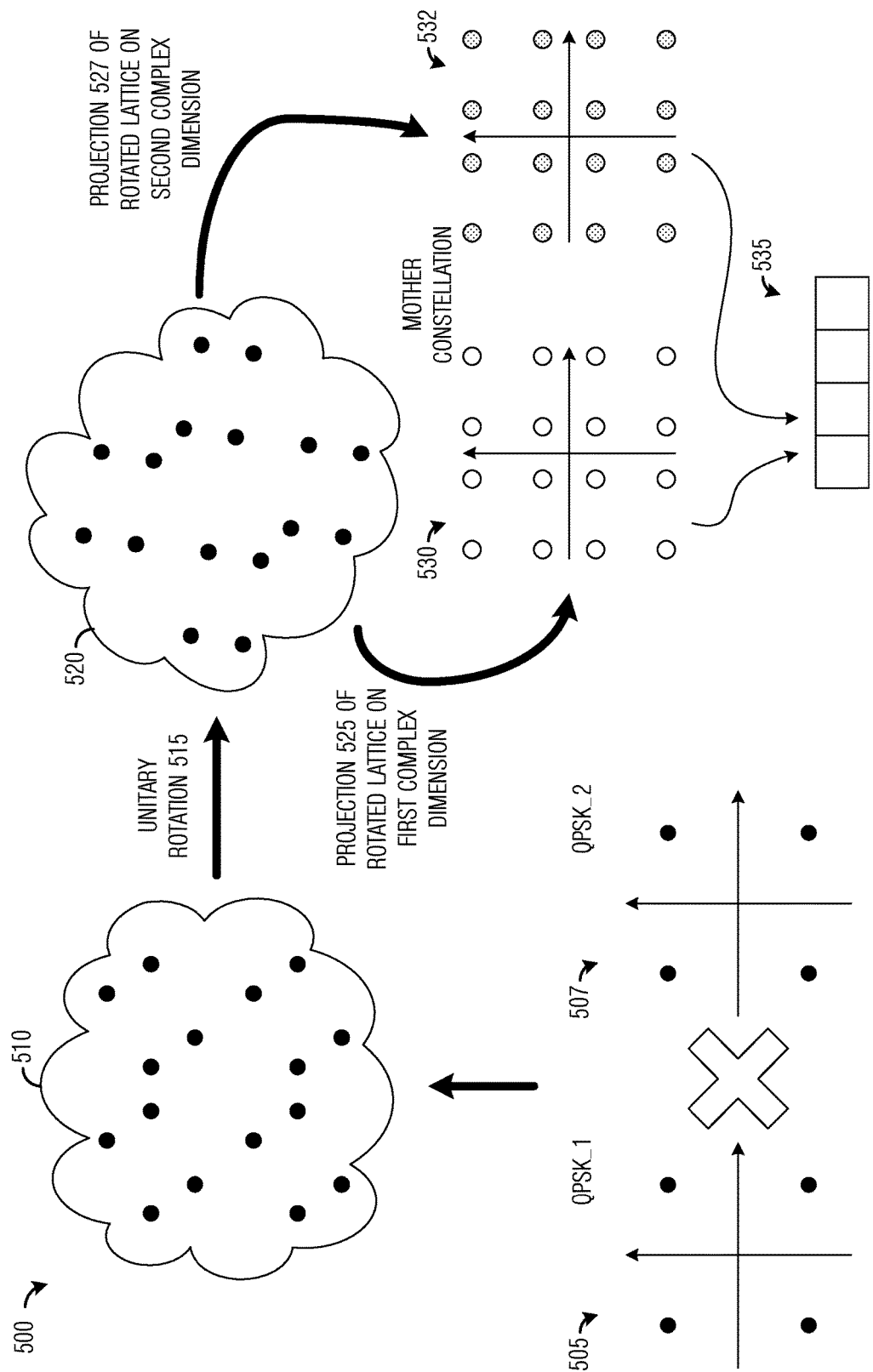
FIG. 5 illustrates an example technique in generating a multidimensional complex constellation according to example embodiments described herein.

FIG. 5 illustrates an example technique 500 in generating a multidimensional complex mother constellation. Technique 500 presents the generating of a multidimensional complex mother constellation from two quadrature phase shift keying (QPSK) constellations.

As shown in FIG. 5, two QPSK constellations (labeled "QPSK$_1$," 505 and "QPSK$_2$," 507) with four points each may be multiplied to produce a 16-point multidimensional constellation in 4 real dimensions (constellation 510). A unitary rotation 515 may be applied to constellation 510 (i.e., the 16-point multidimensional constellation in 4 real dimensions) to produce a 16-point multidimensional constellation in 4 real dimensions with optimized product distance (constellation 520). Constellation 520 may be referred to as multidimensional mother constellation. Projections of constellation 520, which may be a function of unitary rotation 515, may be used to generate codebooks. It is also noted that the number of projections may be dependent on a number of non-zero tones present in a SCMA transmission. As an example, if a SCMA transmission comprises four tones with two of the four tones being non-zero, there will be two projections with specificities of the two projections being dependent on a unitary rotation used. Codewords of codebooks generated from the multidimensional mother constellation (constellation 520) may be selected in accordance with data being transmitted to fill the non-zero tones of a SCMA transmission 535. Furthermore, linear and/or non-linear operations may be applied to the multidimensional mother constellation(s) to produce additional SCMA codebooks. As an example, different linear and/or non-linear operations may be applied to constellation 520 to produce SCMA codebooks for different multiplexed layers and/or users. As shown in FIG. 5, points in the 2 QPSK constellations (constellation 505 and constellation 507) may be represented by 2 bits each. Therefore, in the resulting 16-point multidimensional mother constellation, SCMA blocks may convey 2×2 bits=4 bits of information.

According to an example embodiment, as discussed previously, shuffling of multidimensional constellations in axes, such as real and imaginary axes, may be performed. As with the sub-optimal constellation approach utilizing the multiplication of smaller constellations, computational resources may be saved by rotating orthogonal constellations separately and independently for different axes, such as real and imaginary axes.

Figure 6A:
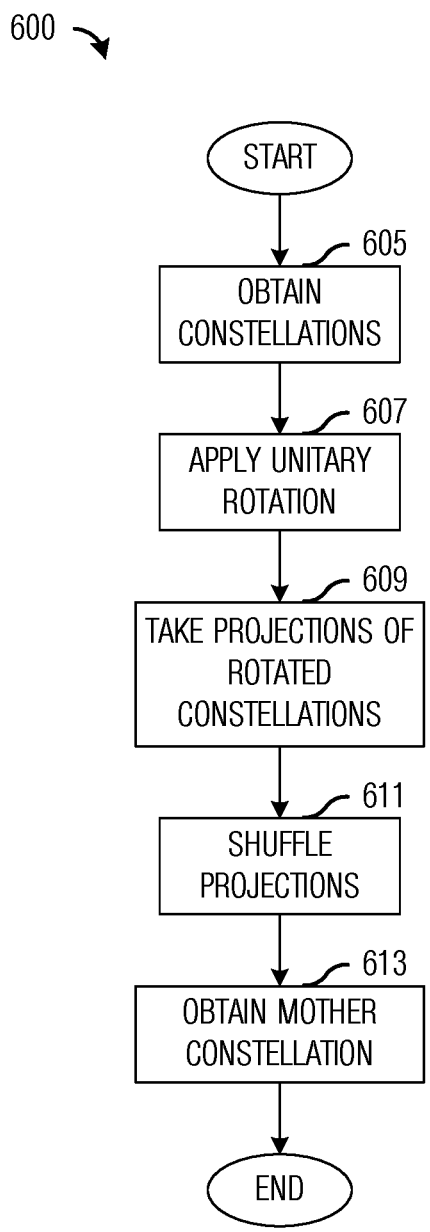
FIG. 6a illustrates an example flow diagram of operations occurring in a device as the device generates a multidimensional complex constellation utilizing shuffling according to example embodiments described herein.

FIG. 6a illustrates a flow diagram of operations 600 occurring in a device as the device generates a multidimensional complex constellation utilizing shuffling. Operations 600 may be indicative of operations occurring in a device, such as a transmitting device, e.g., an eNB transmitting a downlink transmission to a UE, or a UE transmitting an uplink transmission to an eNB, or a designing device that generates codebooks, as the device generates a multidimensional complex constellation.

Operations 600 may begin with the device obtaining constellations (block 605). As an example, the device may obtain two independent N dimensional constellations, where N is an integer value greater than or equal to 2. The N dimensional constellations may be N dimensional QAM constellations or N dimensional lattice constellations. The device may apply a unitary rotation to the constellations (block 607). The device may take projections of the rotated constellations (block 609). The number of projections may be dependent on the unitary rotation applied to the constellations. The device may shuffle the projections (block 611). Shuffling may comprise a reorganization, regrouping, or reordering of the points in the projections of the rotated constellations. The device may obtain a multidimensional mother constellation from the shuffled projections (block 613). The two rotated N dimensional constellations correspond to real and imaginary parts of the constellation points of the multidimensional mother constellation.

The separation of real and imaginary parts of a multidimensional constellation (i.e., the N rotated QAM constellations) may help to reduce decoding complexity at a receiving device while maintaining dependency among the complex dimensions of the multidimensional mother constellation. As an illustrative example, in MPA, if k signatures share the same non-zero tone and if the number of projections of each constellation per real dimension is expressible as m (or $m^2$ per tone or per complex dimension), the complexity of decoding is proportional to $m^{2k}$ without real or imaginary part separation, while it is proportional to $m^k$ with real or imaginary part separation. Therefore, the reduction in complexity is on the order of two times the square root.

Figure 6B:
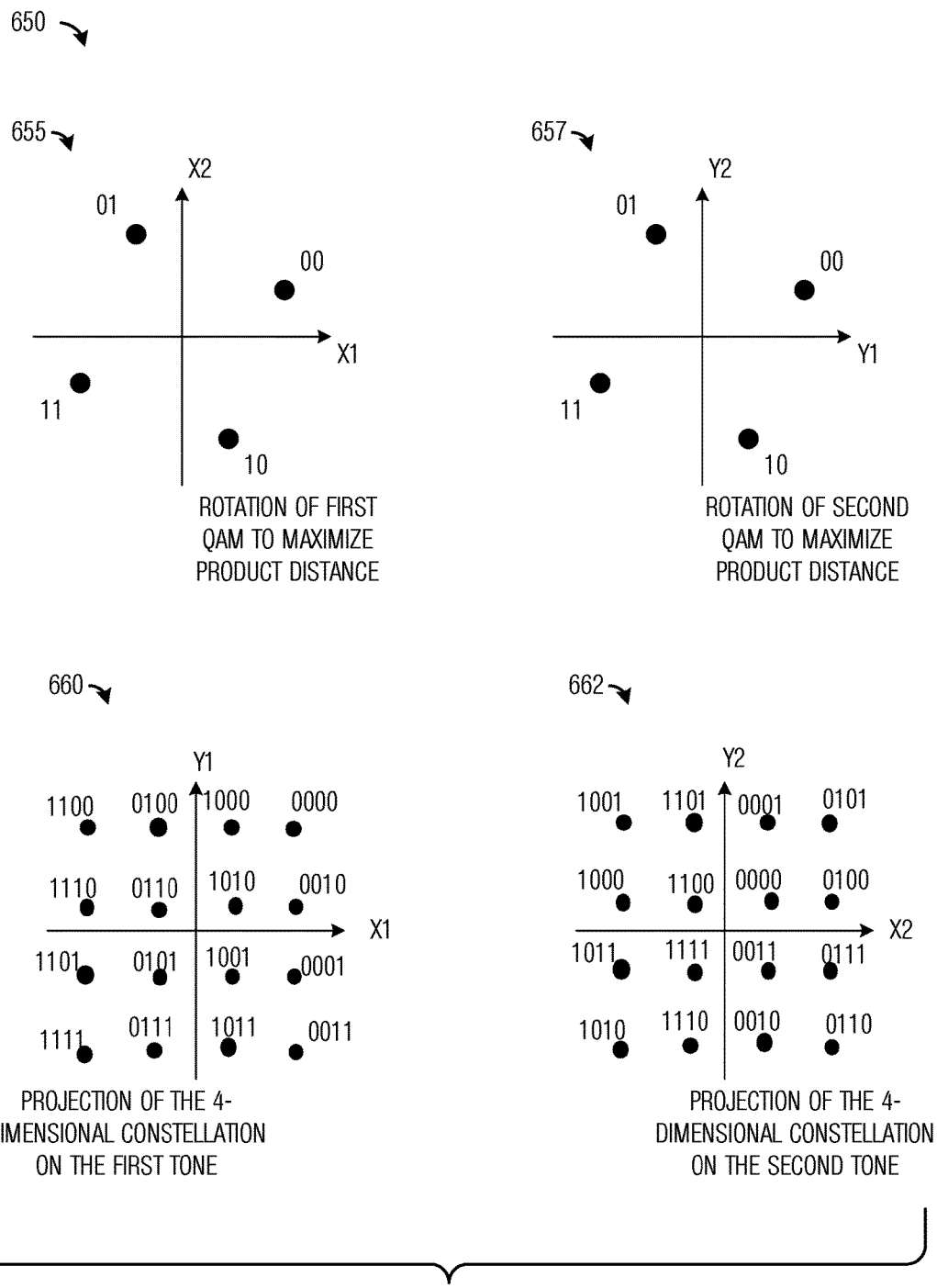
FIG. 6b illustrates an example diagram of an example multidimensional complex constellation generated using shuffling according to example embodiments described herein.

FIG. 6b illustrates a diagram 650 of an example multidimensional complex constellation generated using shuffling. Two independent, rotated 4-point QAM constellations are constructed in two orthogonal complex planes (a first 2 dimensional QAM constellation 655 represents a rotated first QAM to maximize product distance, and a second 2 dimensional QAM constellation 657 represents a rotated second QAM to maximize product distance). The construction results in a 16-point constellation in 4 dimensions. Four bits may be directly assigned to the 4 dimensions (as an example, a first two-bits may be assigned to the projection on the first complex plane and a second two-bits may be assigned to the projection on the second complex plane). Consider, as an example, X1, X2, Y1, and Y2 as real and imaginary parts of projections on the first complex plane and real and imaginary parts of projections on the second complex plane, respectively. It is possible to shuffle the axes and set different axes as real and imaginary parts of the signal in the first and second complex planes. As an example, X1 and Y1 may be set as real and imaginary parts of the signal on a first complex plane (which may be a representation of a tone or a time slot, for example) and X2 and Y2 may be set as real and imaginary parts of the signal on a second complex plane. A first 2 dimensional lattice 660 represents a first projection of a rotated lattice that has first 2 dimensional QAM constellation 655 as a real part and second 2 dimensional QAM constellation 657 as an imaginary part, and a second 2 dimensional lattice 662 represents a second projection of the rotated lattice.

Figure 7:
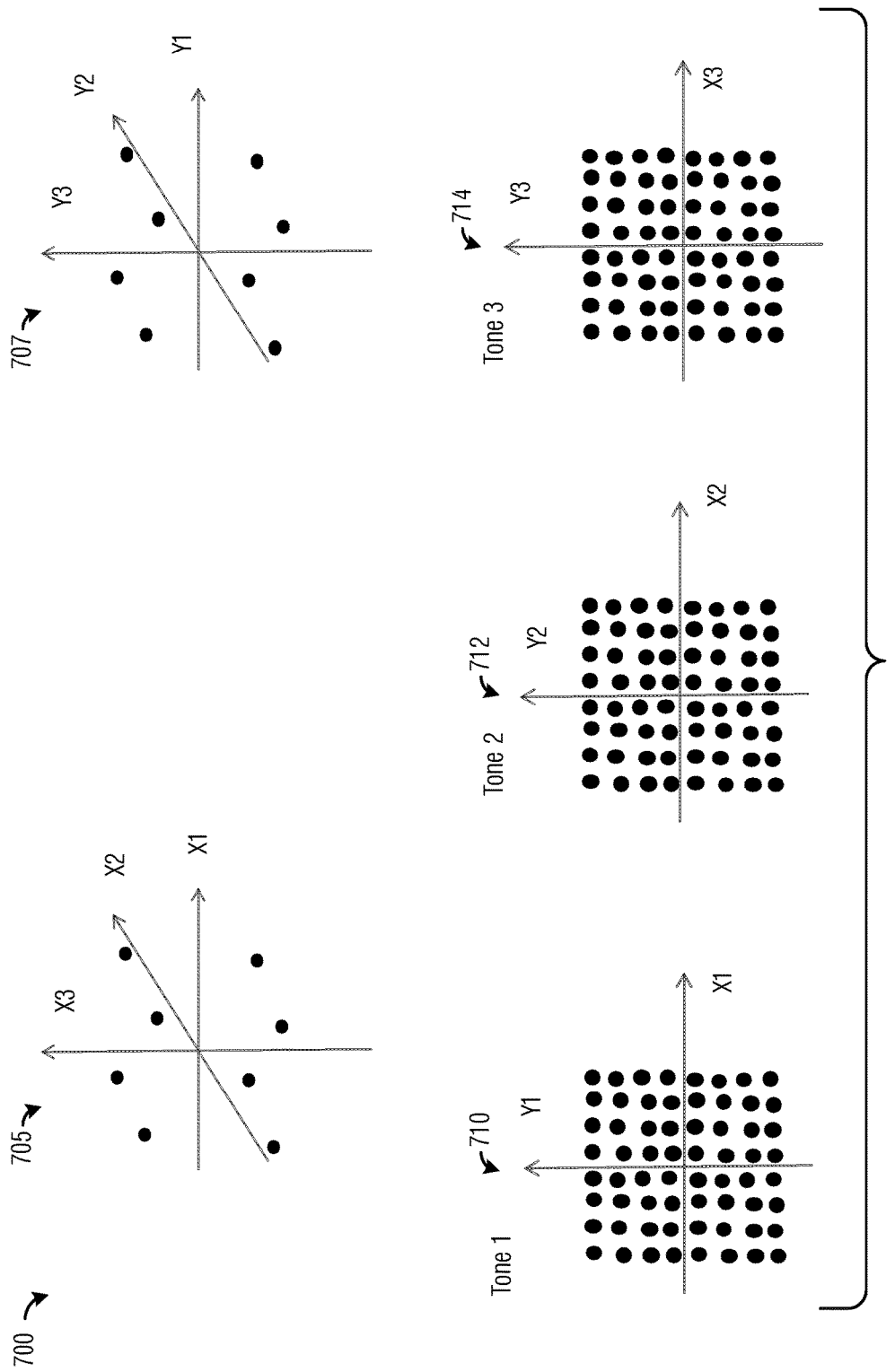
FIG. 7 illustrates an example diagram of an example multidimensional complex constellation generated using shuffling for higher dimensions according to example embodiments described herein.

FIG. 7 illustrates a diagram 700 of an example multidimensional complex constellation generated using shuffling for higher dimensions. A first 3 dimensional QAM constellation 705 represents a rotated first QAM to maximize product distance, and a second 3 dimensional QAM constellation 707 represents a rotated second QAM to maximize product distance. A first 2 dimensional lattice 710 represents a first projection of a rotated lattice that has first 3 dimensional QAM constellation 705 as a real part and second 3 dimensional QAM constellation 707 as an imaginary part, a second 3 dimensional lattice 712 represents a second projection of the rotated lattice, and a third 3 dimensional lattice 714 represents a third projection of the rotated lattice.

According to an example embodiment, a multidimensional constellation with smaller projection per tone may help reduce computational requirements at a receiving device. When MPA is utilized to decode multiplexed codeword(s) at a receiving device, the number of non-zero projections associated with each tone may be important since the more non-zero projections associated with each tone may increase decoding complexity. It may be possible to select a unitary rotation that minimizes the number of non-zero projections associated with each tone, thereby helping to reduce decoding complexity. However, minimum product distance may be sacrificed and performance may be impacted.

Figure 8A:
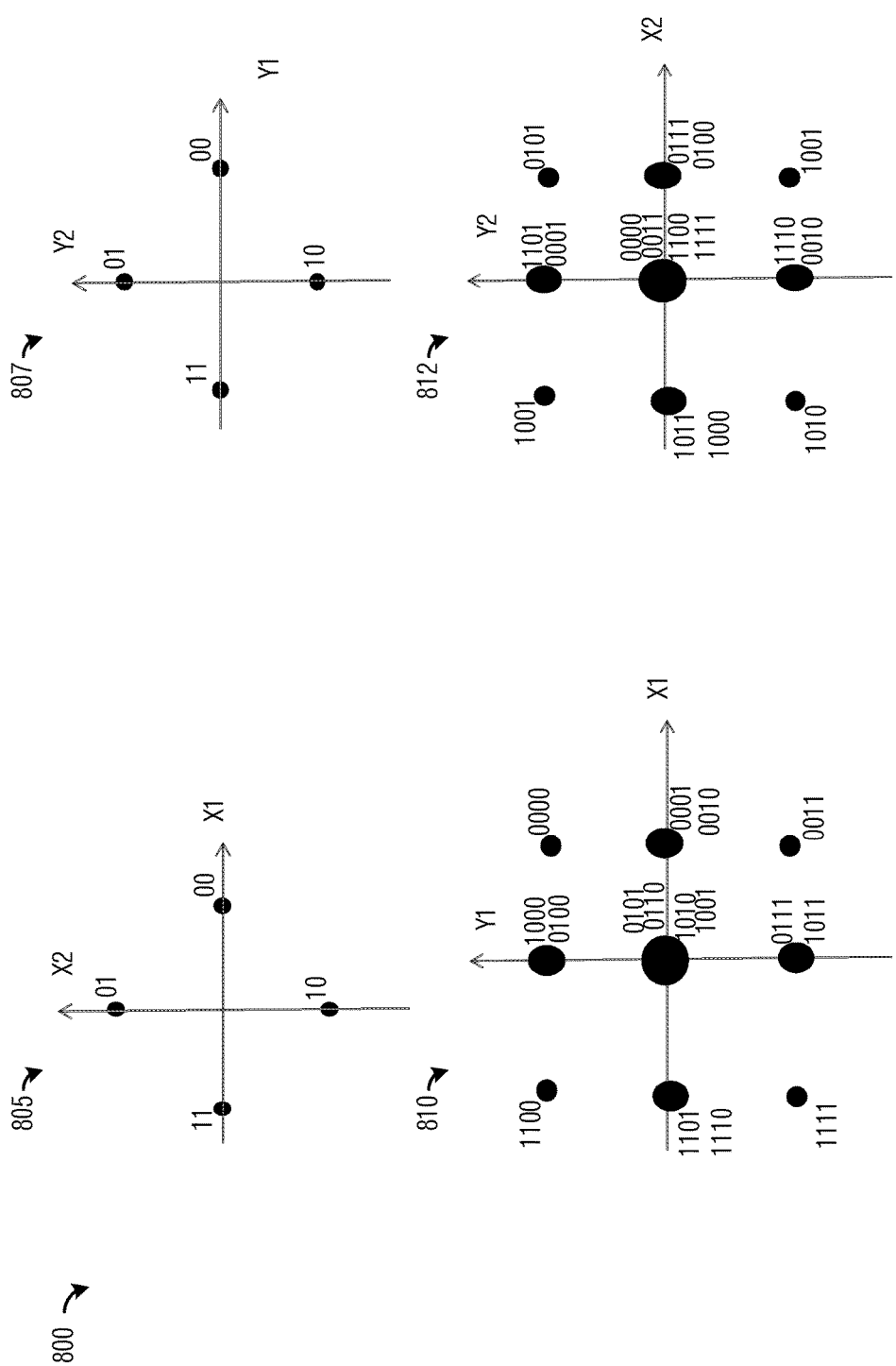
FIG. 8a illustrates an example diagram of an example multidimensional complex constellation generated using a rotation that minimizes non-zero projections according to example embodiments described herein.

FIG. 8a illustrates a diagram 800 of an example multidimensional complex constellation generated using a rotation that minimizes non-zero projections. A first 2 dimensional QAM constellation 805 represents a rotated first QAM, and a second 2 dimensional QAM constellation 807 represents a rotated second QAM. A first 2 dimensional constellation 810 represents a first projection of a rotated constellation that has first 2 dimensional QAM constellation 805 as a real part and second 2 dimensional QAM constellation 807 as an imaginary part, and a second 2 dimensional constellation 810 represents a second projection of the rotated constellation. It is noted that first 2 dimensional lattice 810 and second 2 dimensional lattice 812 have minimal non-zero projections associated with each tone.

Figure 8B:
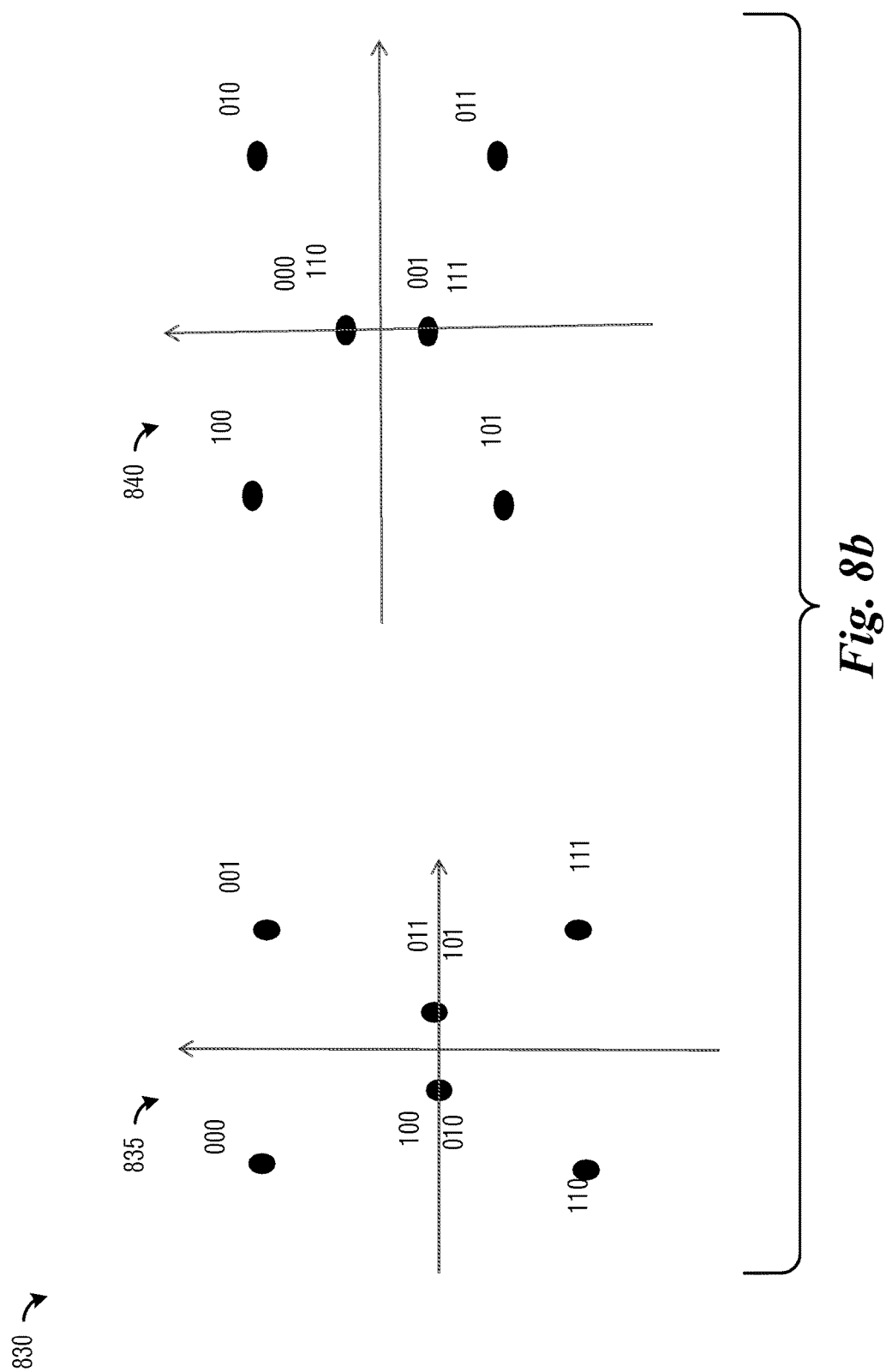
FIG. 8b illustrates an example 8 point complex constellation (T6QAM) according to example embodiments described herein.
Figure 8C:
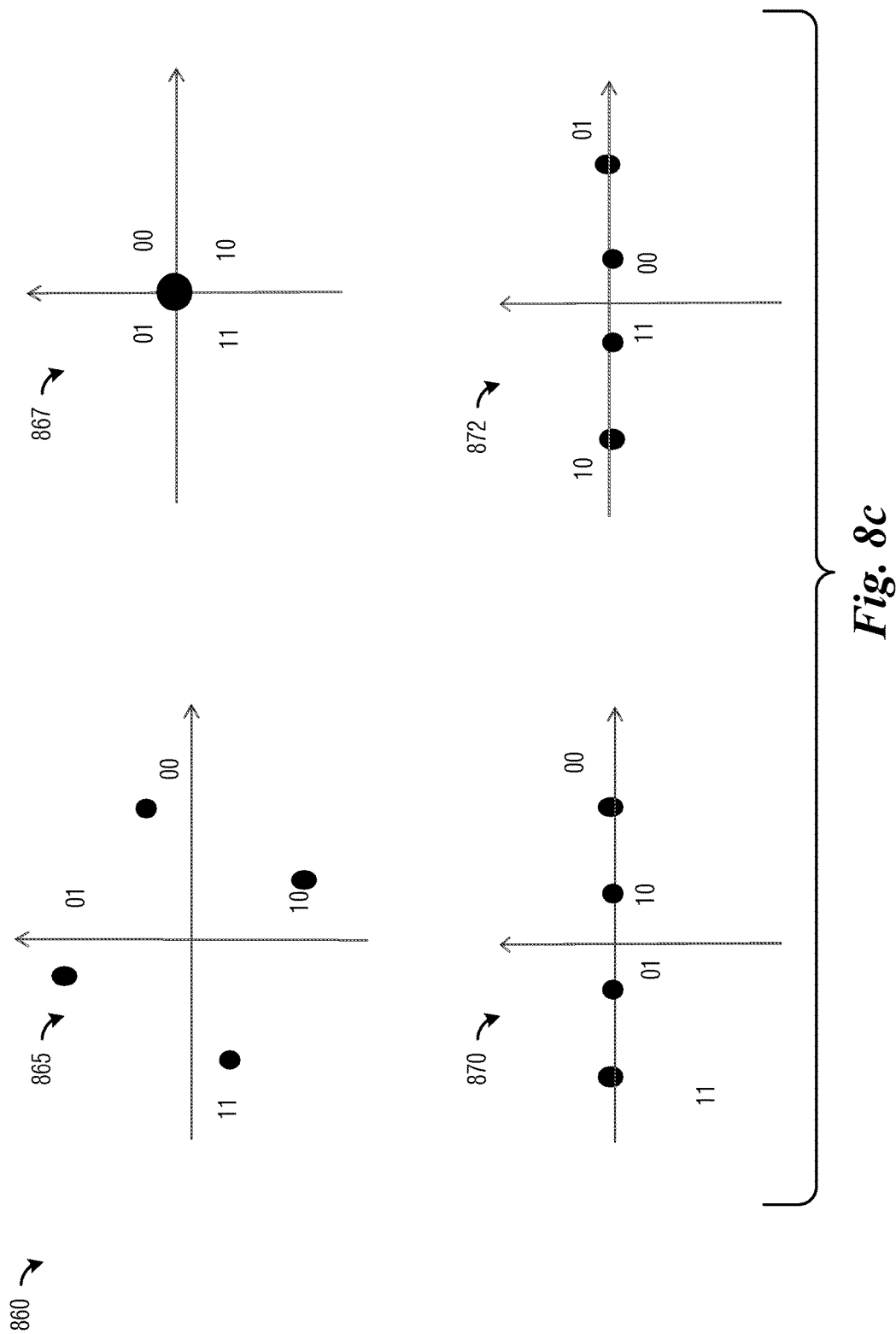
FIG. 8c illustrates an example 4 point complex constellation (T4QAM) according to example embodiments described herein.

FIG. 8b illustrates an 8 point complex constellation (T6QAM) 830. A first constellation 835 is a projection of 8 point complex constellation 830 in a first dimension and a second constellation 840 is a projection of 8 point complex constellation 830 in a second dimension. FIG. 8c illustrates a 4 point complex constellation (T4QAM) 860. A first constellation 865, second constellation 867, third constellation 870, and fourth constellation 872 are projections of 4 point complex constellation 860 in different dimensions.

Figure 9A:
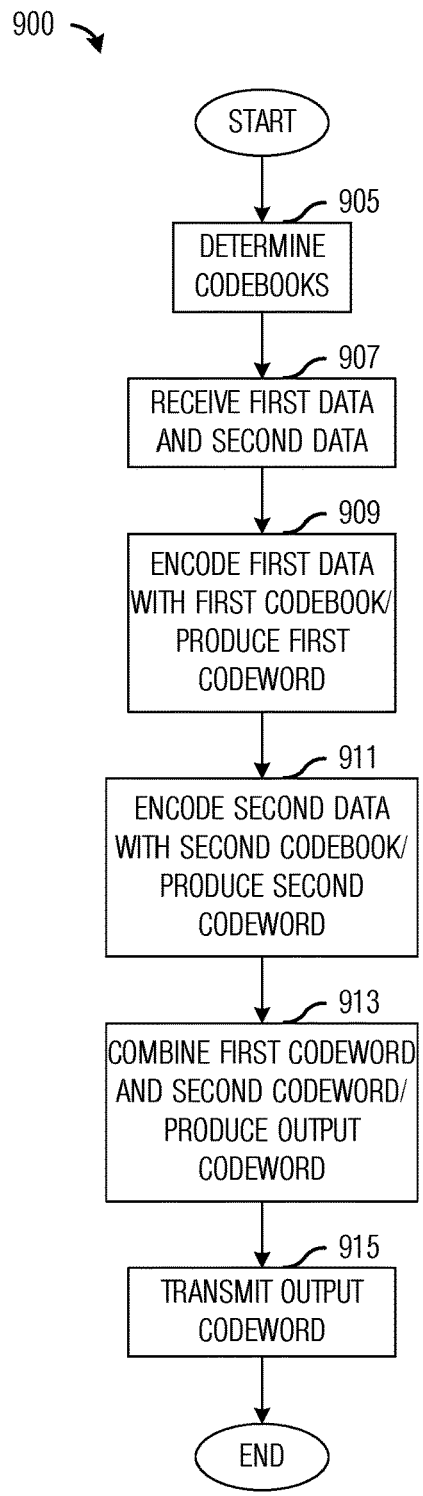
FIG. 9a illustrates an example flow diagram of operations occurring in a transmitting device as the transmitting device transmits information to a receiving device according to example embodiments described herein.

FIG. 9a illustrates a flow diagram of operations 900 occurring in a transmitting device as the transmitting device transmits information to a receiving device. Operations 900 may be indicative of operations occurring in a transmitting device, such as an eNB transmitting a downlink transmission to a UE, or a UE transmitting an uplink transmission to an eNB, as the transmitting device transmits information to a receiving device.

Operations 900 may begin with the transmitting device determining a plurality of codebooks (block 905). According to an example embodiment, the transmitting device may retrieve the plurality of codebooks from a storage device, wherein the plurality of codebooks were designed by a designing device and stored in the storage device. As an illustrative example, the transmitting device may retrieve the plurality of codebooks during an initial power up sequence, during a reset sequence, during an initiating sequence, and the like. As another illustrative example, the transmitting device may be configured to retrieve the plurality of codebooks in a periodic manner, at specified times, upon receipt of an instruction, and the like. According to another example embodiment, the transmitting device may design the plurality of codebooks and store them in a local storage and/or memory for subsequent use.

Figure 9B:
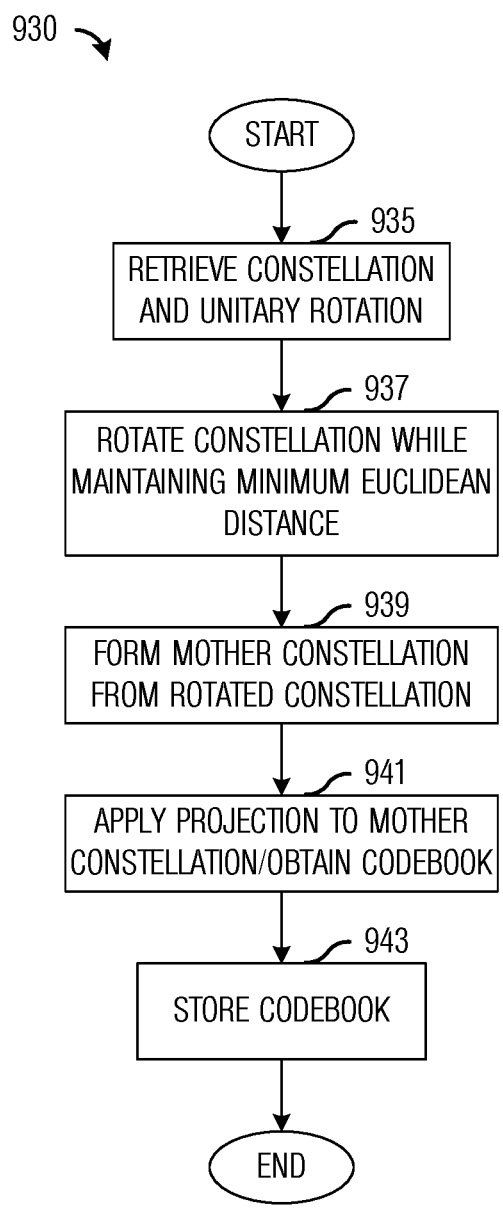
FIG. 9b illustrates an example flow diagram of operations occurring in a device as the device designs a codebook(s) according to example embodiments described herein.

FIG. 9b illustrates a flow diagram of operations 930 occurring in a device as the device designs a codebook(s). Operations 930 may be indicative of operations occurring in a device, such as a transmitting device, e.g., an eNB transmitting a downlink transmission to a UE, or a UE transmitting an uplink transmission to an eNB, or a designing device that generates codebooks, as the device designs a codebook.

Operations 930 may begin with the device retrieving a constellation and a unitary rotation (block 935). The unitary rotation may be selected to optimize a distance function of points in a multidimensional mother constellation. The device may apply the unitary rotation to the constellation while maintaining minimum Euclidean distance (block 937). The device may multiply the constellation with the unitary rotation. The rotated constellation may be used to form the multidimensional complex mother constellation (block 939). Projections and/or sets of operations may be applied to the multidimensional complex mother constellation to derive the codebook(s) (block 941). Furthermore, linear and/or non-linear operations may be applied to the rotated constellation to derive additional codebooks. The device may store the codebook(s) (block 943). The codebook(s) may be stored in a memory, local storage (a hard disk, a solid state memory device, and the like), remote storage (a remote hard disk, a network drive, a data base, and the like), and the like.

Figure 9C:
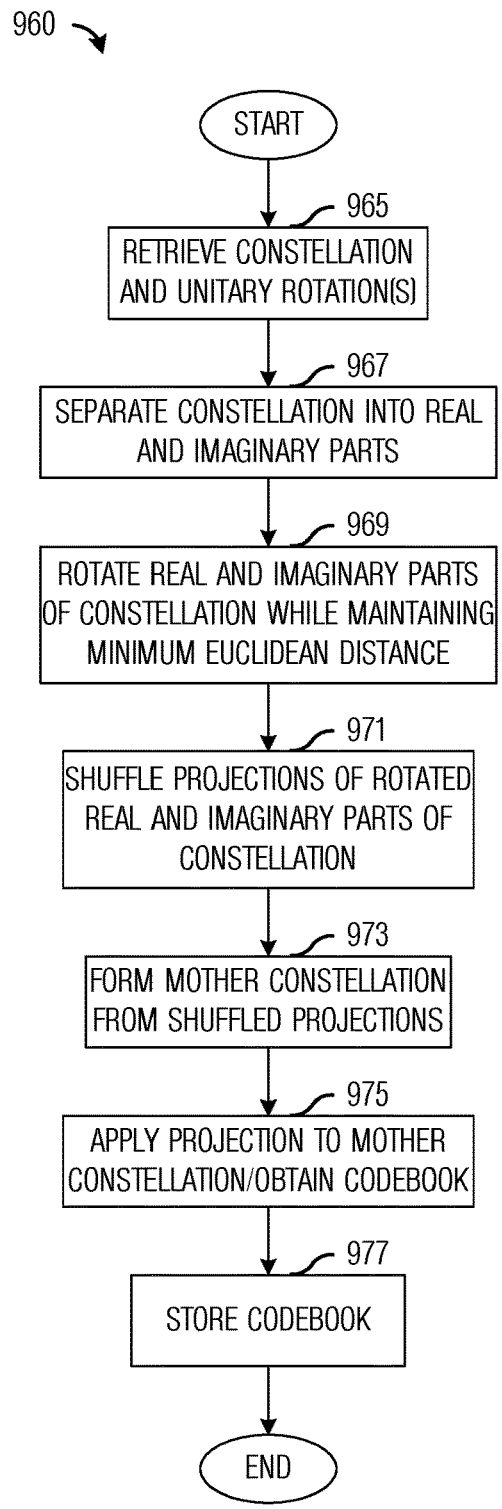
FIG. 9c illustrates an example flow diagram of operations occurring in a device as the device designs a codebook(s) using shuffling according to example embodiments described herein.

FIG. 9c illustrates a flow diagram of operations 960 occurring in a device as the device designs a codebook(s) using shuffling. Operations 960 may be indicative of operations occurring in a device, such as a transmitting device, e.g., an eNB transmitting a downlink transmission to a UE, or a UE transmitting an uplink transmission to an eNB, or a designing device that generates codebooks, as the device designs a codebook using shuffling.

Operations 960 may begin with the device retrieving a constellation and a unitary rotation(s) (block 965). The device may separate the constellation into real and imaginary parts (block 967). It is noted that although the discussion focuses on real and imaginary axes, other axes may be used as long as they are orthogonal. The device may apply the unitary rotation(s) to the real and the imaginary parts of the constellation while maintaining minimum Euclidean distance (block 969). Different unitary rotations may be applied to the real and imaginary parts of the constellation or the same unitary rotation may be applied. The rotated real and imaginary parts of the constellation may be shuffled (block 971). The shuffled and rotated real and imaginary parts may be used as a multidimensional complex mother constellation (block 973). Projections and/or sets of operations may be applied to the multidimensional complex mother constellation to derive the codebook(s) (block 975). Furthermore, linear and/or non-linear operations may be applied before and/or after the shuffling of the rotated real and imaginary parts of the constellation to derive more codebooks. The device may store the codebook(s) (block 977). The codebook(s) may be stored in a memory, a storage device, such as local storage (a hard disk, a solid state memory device, and the like) or remote storage (a remote hard disk, a network drive, a data base, and the like), and the like.

Referring back to FIG. 9a, the transmitting device may receive a first data and a second data (block 907). The first data and the second data may be received at the transmitting device in the form of a first data stream and a second data stream. The transmitting device may encode the first data using a first codebook out of the plurality of codebooks to produce a first codeword (block 909). As an example, the first data may have a first value and the transmitting device may determine which codeword in the first codebook corresponds to the first value and use the codeword as the first codeword. The transmitting device may encode the second data as a second codeword using a second codebook out the plurality of codebooks to produce a second codeword (block 911). As an example, the second data may have a second value and the transmitting device may determine which codeword in the second codebook corresponds to the second value and use the codeword as the second codeword. It is noted that the first codebook and the second codebook are specifically assigned to the first data stream and the second data stream, respectively. It is also noted that although the discussion focuses on the first data stream and the second data stream, there may be a plurality of data streams and the example embodiments presented herein are operable with any number of data streams greater than two.

The transmitting device may combine the first codeword and the second codeword to produce an output codeword (block 913). As discussed previously, the first codeword and the second codeword may be added together to form the output codeword. The transmitting device may transmit the output codeword (block 915). The output codeword may be transmitted over shared resources of the communications system.

Figure 10:
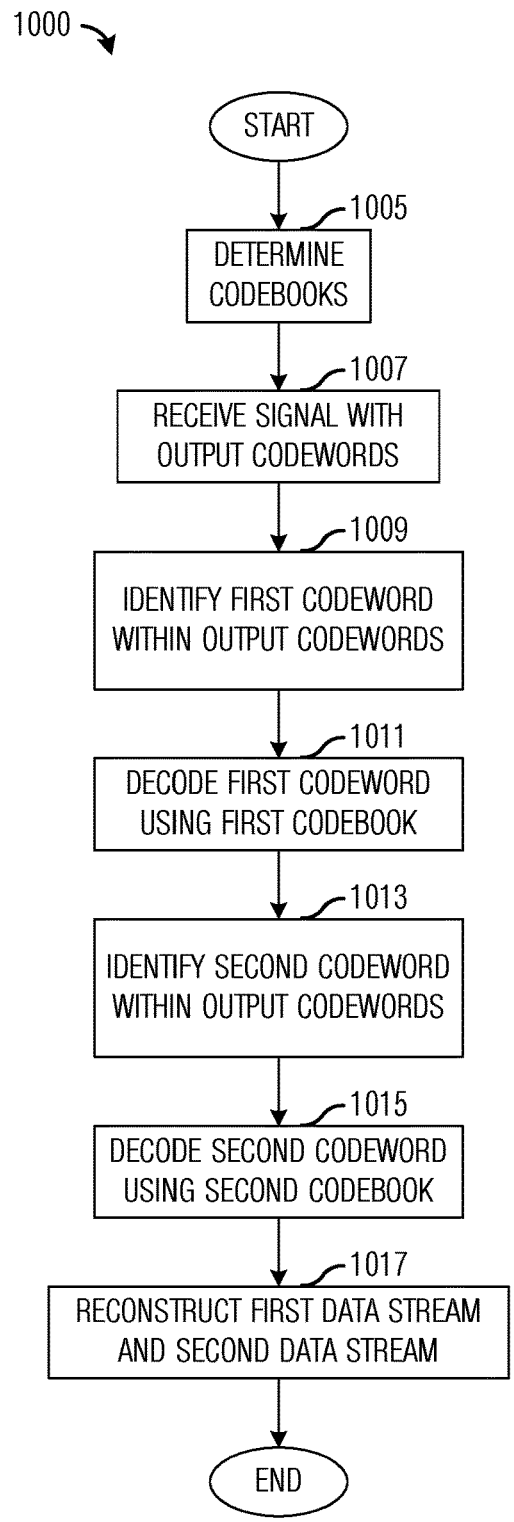
FIG. 10 illustrates an example flow diagram of operations occurring in a device as the device receives information from a transmitting device according to example embodiments described herein.

FIG. 10 illustrates a flow diagram of operations 1000 occurring in a device as the device receives information from a transmitting device. Operations 1000 may be indicative of operations occurring in a receiving device, such as an eNB receiving an uplink transmission from a UE, or a UE receiving a downlink transmission from an eNB, as the receiving device receives information from a transmitting device.

Operations 1000 may begin the receiving device determining a plurality of codebooks (block 1005). According to an example embodiment, the receiving device may retrieve the plurality of codebooks from a storage device, wherein the plurality of codebooks were designed by a designing device and stored in the storage device. As an illustrative example, the receiving device may retrieve the plurality of codebooks during an initial power up sequence, during a reset sequence, during an initiating sequence, and the like. As another illustrative example, the receiving device may be configured to retrieve the plurality of codebooks in a periodic manner, at specified times, upon receipt of an instruction, and the like. According to another example embodiment, the receiving device may design the plurality of codebooks and store them in a local storage and/or memory for subsequent use.

The receiving device may receive a signal with an output codeword (block 1007). The signal may be received over shared resources of the communications system. The receiving device may identify a first codeword from the output codeword (block 1009). The first codeword may be associated with a first codebook assigned to a first layer and may be identified in accordance with a decoding algorithm, such as MPA. The receiving device may decode the first codeword using the first codebook to determine a first data (block 1011). The receiving device may identify a second codeword from the output codeword (block 1013). The second codeword may be associated with a second codebook assigned to a second layer and may be identified in accordance with the decoding algorithm. The receiving device may decode the second codeword using the second codebook to determine a second data (block 1015). It is also noted that although the discussion focuses on the first layer and the second layer, there may be a plurality of layers and the example embodiments presented herein are operable with any number of layers greater than two. The receiving device may reconstruct a first data stream from the first data and a second data stream for the second data, respectively (block 1017).

Figure 11A:
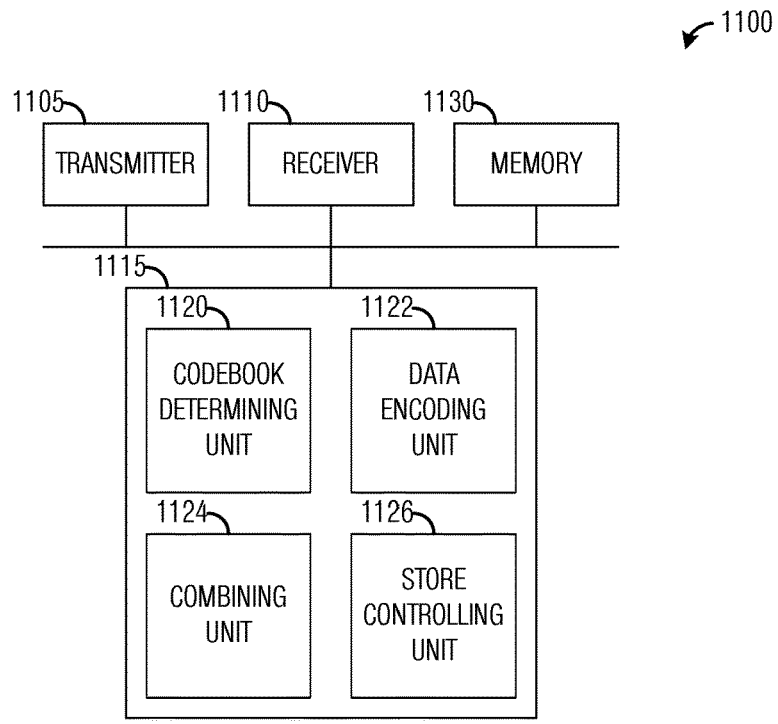
FIG. 11a illustrates an example first device according to example embodiments described herein.

FIG. 11a illustrates a first device 1100. Device 1100 may be an implementation of a communications controller, such as a base station, an access point, a NodeB, an eNB, a base terminal station, and the like, or a user equipment, such as a mobile station, a user, a subscriber, a terminal, and the like, or a designing device configured to generate codebooks. Device 1100 may be used to implement various ones of the embodiments discussed herein. As shown in FIG. 11a, a transmitter 1105 is configured to transmit packets, and the like. Device 1100 also includes a receiver 1110 that is configured to receive packets, and the like.

A codebook determining unit 1120 is configured to generate a multidimensional mother constellation from a constellation by applying a unitary rotation to the constellation. Codebook determining unit 1120 is configured to generate a codebook from the multidimensional mother constellation by applying a set of operations, such as mapping operations, dimensional permutation operations, phase rotation operations, conjugate operations, and combinations thereof. Codebook determining unit 1120 is configured to make projections of the rotated constellation, as well as shuffle axes. Codebook determining unit 1120 is configured to apply linear and/or non-linear operations to the constellations and/or projections. Codebook determining unit 1120 is configured to retrieve a codebook from a storage device. A data encoding unit 1122 is configured to encode data for a layer or user utilizing a codebook assigned to the layer or user. Data encoding unit 1122 is configured to select a codeword from the codebook in accordance with a value of the data. A combining unit 1124 is configured to combine codewords together to produce an output codeword. A store controlling unit 1126 is configured to control the storing and/or retrieving of information, such as codebooks, from a storage device, such as a memory, a local storage, a remote storage, and the like. A memory 1130 is configured to store constellations, multidimensional mother constellations, unitary rotations, data, codebooks, codewords, output codewords, and the like.

The elements of device 1100 may be implemented as specific hardware logic blocks. In an alternative, the elements of device 1100 may be implemented as software executing in a processor, controller, application specific integrated circuit, or so on. In yet another alternative, the elements of device 1100 may be implemented as a combination of software and/or hardware.

As an example, receiver 1110 and transmitter 1105 may be implemented as a specific hardware block, while codebook determining unit 1120, data encoding unit 1122, multiplexing unit 1124, and store controlling unit 1126 may be software modules executing in a microprocessor (such as processor 1115) or a custom circuit or a custom compiled logic array of a field programmable logic array. Codebook determining unit 1120, data encoding unit 1122, multiplexing unit 1124, and store controlling unit 1126 may be modules stored in memory 1130.

Figure 11B:
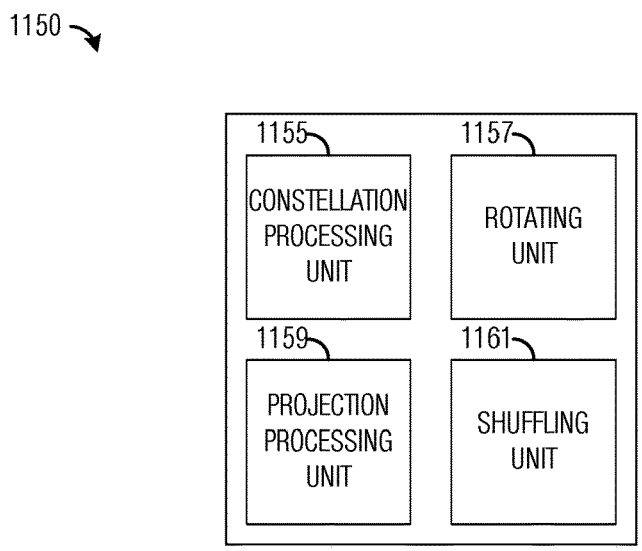
FIG. 11b illustrates a detailed view of an example codebook determining unit according to example embodiments described herein.

FIG. 11b illustrates a detailed view of an example codebook determining unit 1150 configured to generate codebooks. Codebook determining unit 1150 includes a constellation processing unit 1155, a rotating unit 1157, a projection processing unit 1159, and a shuffling unit 1161. Constellation processing unit 1155 is configured to process constellations, including multiplying constellations together, extracting parts, e.g., real and/or imaginary parts, of constellations, and the like. Rotating unit 1157 is configured to apply a unitary rotation to the constellation. The unitary rotation may optimize a distance function, such as maximize a minimum Euclidean distance. Projection processing unit 1159 is configured to make projection, e.g., along certain axes, of a constellation. Shuffling unit 1161 is configured to shuffle axes of a constellation.

Figure 12:
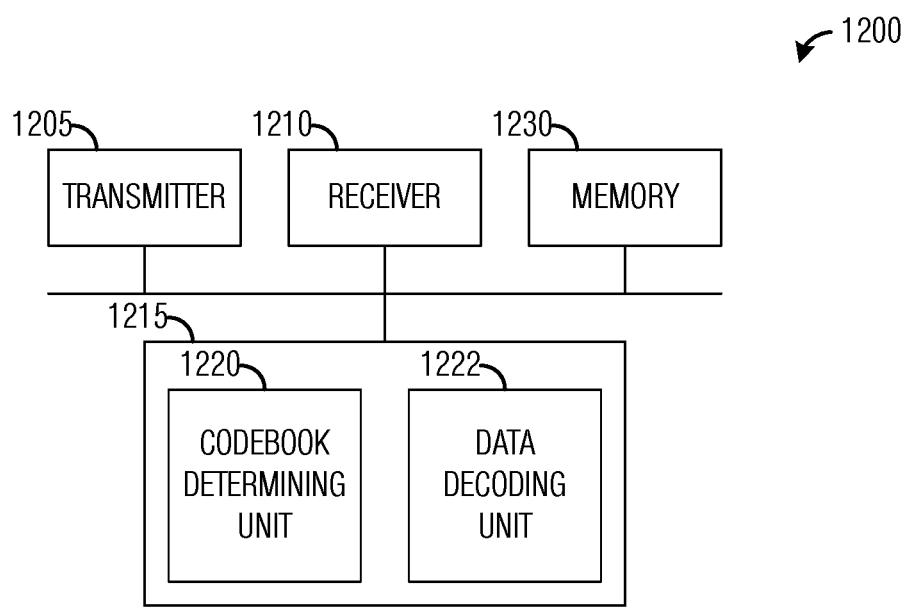
FIG. 12 illustrates an example second device according to example embodiments described herein.

FIG. 12 illustrates a second device 1200. Device 1200 may be an implementation of receiving device, including a communications controller, such as a base station, an access point, a NodeB, an eNB, a base terminal station, and the like, or a user equipment, such as a mobile station, a user, a subscriber, a terminal, and the like. Device 1200 may be used to implement various ones of the embodiments discussed herein. As shown in FIG. 12, a transmitter 1205 is configured to transmit packets, and the like. Device 1200 also includes a receiver 1210 that is configured to receive packets, and the like.

A codebook determining unit 1220 is configured to generate a multidimensional mother constellation from a constellation by applying a unitary rotation to the constellation. Codebook determining unit 1120 is configured to generate a codebook from the multidimensional mother constellation by applying a set of operations, such as mapping operations, dimensional permutation operations, phase rotation operations, conjugate operations, and combinations thereof. Codebook determining unit 1220 is configured to make projections of the rotated constellation, as well as shuffle axes. Codebook determining unit 1220 is configured to apply linear and/or non-linear operations to the constellations and/or projections. Codebook determining unit 1220 is configured to retrieve a codebook from a storage device. A data decoding unit 1222 is configured to decode data for a layer or user from a output codeword utilizing a codebook assigned to the layer or user. Data decoding unit 1222 is configured to identify a codeword for a layer or user from the output codeword using a decoding algorithm such as MPA and match up the codeword to decoded data using the codebook. A memory 1230 is configured to store constellations, multidimensional mother constellations, unitary rotations, data, codebooks, codewords, output codewords, and the like.

The elements of device 1200 may be implemented as specific hardware logic blocks. In an alternative, the elements of device 1200 may be implemented as software executing in a processor, controller, application specific integrated circuit, or so on. In yet another alternative, the elements of device 1200 may be implemented as a combination of software and/or hardware.

As an example, receiver 1210 and transmitter 1205 may be implemented as a specific hardware block, while codebook determining unit 1220, and data decoding unit 1222 may be software modules executing in a microprocessor (such as processor 1215) or a custom circuit or a custom compiled logic array of a field programmable logic array. Codebook determining unit 1220, and data decoding unit 1222 may be modules stored in memory 1230.

Embodiments of the present invention are provided below.

1. A method for generating a codebook of a plurality of codebooks, the method comprising:
applying, by a designing device, a unitary rotation to a baseline multidimensional constellation to produce a multidimensional mother constellation, wherein the unitary rotation is selected to optimize a distance function of the multidimensional mother constellation;
applying, by the designing device, a set of operations to the multidimensional mother constellation to produce a set of constellation points; and
storing, by the designing device, the set of constellation points as the codebook of the plurality of codebooks.

2. The method of Embodiment 1, wherein the distance function comprises a minimum product distance of the multidimensional mother constellation, and wherein the unitary rotation is selected to maximize the minimum product distance of the multidimensional mother constellation.

3. The method of Embodiment 1, wherein the distance function comprises one of an average product distance of the multidimensional mother constellation, and a minimum of a generalized mean of distances of projections of pairs of constellation points of the multidimensional mother constellation with power p, where p is a real value between [0, 1].

4. The method of Embodiment 1, wherein the baseline multidimensional constellation is selected to at least one of maximize a minimum Euclidean distance between points in the baseline multidimensional constellation and reduce a number of neighboring points to each point in the baseline multidimensional constellation.

5. The method of Embodiment 1, wherein the multidimensional mother constellation is a N-dimensional complex constellation, where N is an integer number greater than or equal to 2, and wherein the baseline multidimensional constellation comprises one of an N-dimensional complex constellation, an N-dimensional lattice constellation, and a product of N quadrature amplitude modulation (QAM) constellations.

6. The method of Embodiment 1, wherein the multidimensional mother constellation is a N-dimensional complex constellation, where N is an integer number greater than or equal to 2, wherein the baseline multidimensional constellation comprises a first N-dimensional real constellation and a second N-dimensional real constellation, wherein the unitary rotation comprises a first unitary rotation and a second unitary rotation, and wherein applying the unitary rotation to the baseline multidimensional constellation comprises:
applying the first unitary rotation to the first N-dimensional real constellation to produce a first rotated constellation;
applying the second unitary rotation to the second N-dimensional real constellation to produce a second rotated constellation; and
shuffling axes of the first rotated constellation and axes of the second rotated constellation to produce the multidimensional mother constellation.

7. The method of Embodiment 1, wherein the set of operations comprises at least one of a mapping operation, a dimensional permutation operation, a phase rotation operation, and a conjugate operation.

8. The method of Embodiment 1, wherein the set of operations comprises projections.

9. A method for transmitting data, the method comprising:
determining, by a transmitting device, a plurality of codebooks, wherein each codebook is generated by applying a unitary rotation to a baseline multidimensional constellation to produce a multidimensional mother constellation and applying a set of operations to the multidimensional mother constellation to produce the codebook, wherein the unitary rotation is selected to optimize a distance function of the multidimensional mother constellation;
encoding, by the transmitting device, a first data associated with a first data layer by selecting a first codeword from a first codebook, where the first codebook is assigned exclusively to the first data layer;
encoding, by the transmitting device, a second data associated with a second data layer by selecting a second codeword from a second codebook and assigning the second codebook exclusively to the second data layer; and
transmitting, by the transmitting device, the first codeword and the second codeword.

10. The method of Embodiment 9, further comprising:
combining the first codeword and the second codeword to produce an output codeword; and
transmitting the output codeword.

11. The method of Embodiment 9, wherein determining the plurality of codebooks comprises retrieving the plurality of codebooks from storage device.

12. The method of Embodiment 9, wherein transmitting the first codeword and the second codeword occurs over shared resources of a communications network.

13. The method of Embodiment 9, wherein encoding the first data comprises:

selecting the first codeword from a first plurality of codewords in the first codebook in accordance with a first value of the first data.

14. A method for receiving data, the method comprising:

determining, by a receiving device, a plurality of codebooks, wherein each codebook is generated by applying a unitary rotation to a baseline multidimensional constellation to produce a multidimensional mother constellation and applying a set of operations to the multidimensional mother constellation to produce the codebook, wherein the unitary rotation is selected to optimize a distance function of the multidimensional mother constellation;

receiving, by the receiving device, an output codeword including a plurality of codewords, wherein each codeword belonging to a different one of the plurality of codebooks, wherein each of the plurality of codebooks is associated with a different one of a plurality of data layers;

identifying, by the receiving device, a first one of a plurality of codewords within the output codeword, the first codeword belonging to a first one of the plurality of codebooks assigned exclusively to a first one of the plurality of data layers; and decoding, by the receiving device, the first codeword to produce a first data.

15. The method of Embodiment 14, wherein the first codeword is identified using a message passing algorithm (MPA).

16. The method of Embodiment 14, wherein decoding the first codeword comprises:

searching the first codebook for an index associated with an entry in the first codebook corresponding to the first codeword; and setting the first data to be equal to the index.

17. A designing device comprising:

a processor configured to apply a unitary rotation to a baseline multidimensional constellation to produce a multidimensional mother constellation, wherein the unitary rotation is selected to optimize a distance function of the multidimensional mother constellation, to apply a set of operations to the multidimensional mother constellation to produce a set of constellation points, and to store the set of constellation points as a codebook of a plurality of codebooks.

18. The designing device of Embodiment 17, wherein the distance function comprises a minimum product distance of the multidimensional mother constellation, and wherein the unitary rotation maximizes the minimum product distance of the multidimensional mother constellation.

19. The designing device of Embodiment 17, wherein the baseline multidimensional constellation is selected to maximize a minimum Euclidean distance between points in the baseline multidimensional constellation.

20. The designing device of Embodiment 17, wherein the multidimensional mother constellation is a N-dimensional complex constellation, where N is an integer number greater than or equal to 2, wherein the baseline multidimensional constellation comprises a first N-dimensional real constellation and a second N-dimensional real constellation, wherein the unitary rotation comprises a first unitary rotation and a second unitary rotation, and wherein the processor is configured to apply the first unitary rotation to the first N-dimensional real constellation to produce a first rotated constellation, to apply the second unitary rotation to the second N-dimensional real constellation to produce a second rotated constellation, and to shuffle axes of the first rotated constellation and axes of the second rotated constellation to produce the multidimensional mother constellation.

21. A transmitting device comprising:

a processor configured to determine a plurality of codebooks, wherein each codebook is generated by applying a unitary rotation to a baseline multidimensional constellation to produce a multidimensional mother constellation, the unitary rotation selected to optimize a distance function of the multidimensional mother constellation, and applying a set of operations to the multidimensional mother constellation to produce the codebook, to encode a first data associated with a first data layer by selecting a first codeword from a first codebook, where the first codebook is assigned exclusively to the first data layer, and to encode a second data associated with a second data layer by selecting a second codeword from a second codebook and assigning the second codebook exclusively to the second data layer; and a transmitter operatively coupled to the processor, the transmitter configured to transmit the first codeword and the second codeword.

22. The transmitting device of Embodiment 21, wherein the processor is configured to combine the first codeword and the second codeword to produce an output codeword, and wherein the transmitter is configured to transmit the output codeword.

23. The transmitting device of Embodiment 21, wherein the processor is configured to select the first codeword from a first plurality of codewords in the first codebook in accordance with a first value of the first data.

24. A receiving device comprising:

a processor configured to determine a plurality of codebooks, wherein each codebook is generated by applying a unitary rotation to a baseline multidimensional constellation while maintaining a minimum Euclidean distance of the baseline multidimensional constellation to produce a multidimensional mother constellation and applying a set of operations to the multidimensional mother constellation to produce the codebook, to identify a first one of a plurality of codewords within an output codeword, the first codeword belonging to a first one of the plurality of codebooks assigned exclusively to a first one of a plurality of data layers, and to decode the first codeword to produce a first data, wherein the output codeword includes a plurality of codewords, wherein each codeword belongs to a different one of the plurality of codebooks, and wherein each of the plurality of codebooks is associated with a different one of the plurality of data layers; and a receiver operatively coupled to the processor, the receiver configured to receive the output codeword.

25. The receiving device of Embodiment 24, wherein the processor is configured to identify the first codeword using a message passing algorithm (MPA).

26. The receiving device of Embodiment 24, wherein the processor is configured to search the first codebook for an index associated with an entry in the first codebook corresponding to the first codeword, and to set the first data to be equal to the index.

Although the present disclosure and its advantages have been described in detail, it should be understood that various changes, substitutions and alterations can be made herein without departing from the spirit and scope of the disclosure as defined by the appended claims.

What is claimed is:

1. A method for multiple access communication, the method comprising:
    encoding, by a transmitting device, a first data using a multidimensional mother constellation to produce an encoded codeword, the multidimensional mother constellation generated from unitary rotations of at least two smaller constellations and generated from shuffling axes of the rotated at least two smaller constellations; and
    transmitting, by the transmitting device, the encoded codeword.

2. The method of claim 1, further comprising retrieving a codebook in accordance with the multidimensional mother constellation from a storage device.

3. The method of claim 2, wherein encoding the first data comprises:
    selecting the encoded codeword from a first plurality of codewords in the codebook in accordance with a first value of the first data.

4. The method of claim 1, wherein the multidimensional mother constellation is a N-dimensional complex constellation, where N is an integer number greater than or equal to 2.

5. The method of claim 1, wherein the multidimensional mother constellation has an optimized product distance function comprises a function of distances of a plurality of projection points corresponding to points of the multidimensional mother constellation.

6. The method of claim 1, further comprising applying a set of operations to the multidimensional mother constellation to produce a set of constellation points using gray labeling.

7. The method of claim 1, the at least two smaller constellations including a quadrature amplitude modulation (QAM) constellation.

8. The method of claim 1, wherein shuffling the axes of the rotated at least two smaller constellations comprises a reorganization, regrouping, or reordering of real and imaginary components of constellation points in the rotated at least two smaller constellations.

9. A method for receiving data, the method comprising:
    receiving, by a receiving device, a codeword; and
    decoding, by the receiving device, the codeword to produce a first data using a multidimensional mother constellation, the multidimensional mother constellation generated from unitary rotations of at least two smaller constellations and generated from shuffling axes of the rotated at least two smaller constellations.

10. The method of claim 9, wherein the codeword is identified using a message passing algorithm (MPA).

11. The method of claim 9, wherein decoding the codeword comprises:
    searching a codebook for an index associated with an entry in the codebook corresponding to the codeword; and
    setting the first data to be equal to the index.

12. The method of claim 9, wherein the multidimensional mother constellation has an optimized product distance function comprises a function of distances of a plurality of projection points corresponding to points of the multidimensional mother constellation.

13. The method of claim 9, further comprising applying a set of operations to the multidimensional mother constellation to produce a set of constellation points using gray labeling.

14. The method of claim 9, the at least two smaller constellations including a quadrature amplitude modulation (QAM) constellation.

15. The method of claim 9, wherein shuffling the axes of the rotated at least two smaller constellations comprises a reorganizing, regrouping, or reordering of real and imaginary components of constellation points in the rotated at least two smaller constellations.

16. A transmitting device comprising:
    a processor configured to encode a first data using a multidimensional mother constellation to produce an encoded codeword, the multidimensional mother constellation generated from unitary rotations of at least two smaller constellations and generated from shuffling axes of the rotated at least two smaller constellations, and
    a transmitter operatively coupled to the processor, the transmitter configured to transmit the encoded codeword.

17. The transmitting device of claim 16, further comprising the processor configured to retrieve a codebook in accordance with the multidimensional mother constellation from a storage device.

18. The transmitting device of claim 17, further comprising the processor configured to select the encoded codeword from a first plurality of codewords in the codebook in accordance with a first value of the first data.

19. The transmitting device of claim 16, wherein the multidimensional mother constellation is a N-dimensional complex constellation, where N is an integer number greater than or equal to 2.

20. The transmitting device of claim 16, wherein the multidimensional mother constellation has an optimized product distance function comprises a function of distances of a plurality of projection points corresponding to points of the multidimensional mother constellation.

21. The transmitting device of claim 16, further comprising the processor configured to apply a set of operations to the multidimensional mother constellation to produce a set of constellation points using gray labeling.

22. The transmitting device of claim 16, wherein the at least two smaller constellations includes a quadrature amplitude modulation (QAM) constellation.

23. The transmitting device of claim 16, wherein shuffling the axes of the rotated at least two smaller constellations comprises a reorganizing, regrouping, or reordering of real and imaginary components of constellation points in the rotated at least two smaller constellations.

24. A receiving device comprising
    a receiver, configured to receive a codeword; and
    a processor operatively coupled to the receiver, the receiver configured to decode the codeword to produce a first data using a multidimensional mother constellation, the multidimensional mother constellation generated from unitary rotations of at least two smaller constellations and generated from shuffling axes of the rotated at least two smaller constellations.

25. The receiving device of claim 24, wherein the codeword is identified using a message passing algorithm (MPA).

26. The receiving device of claim 24, further comprising the processor configured to:
    search a codebook for an index associated with an entry in the codebook corresponding to the codeword; and
    set the first data to be equal to the index.

27. The receiving device of claim 24, wherein the multidimensional mother constellation has an optimized product distance function comprises a function of distances of a plurality of projection points corresponding to points of the multidimensional mother constellation.

28. The receiving device of claim 24, further comprising the processor configured to apply a set of operations to the multidimensional mother constellation to produce a set of constellation points using gray labeling.

29. The receiving device of claim 24, wherein the at least two smaller constellations includes a quadrature amplitude modulation (QAM) constellation.

30. The receiving device of claim 24, wherein shuffling the axes of the rotated at least two smaller constellations comprises a reorganizing, regrouping, or reordering of real and imaginary components of constellation points in the rotated at least two smaller constellations.

\* \* \* \* \*